(12) United States Patent
Chen et al.

(10) Patent No.: US 8,987,098 B2
(45) Date of Patent: *Mar. 24, 2015

(54) DAMASCENE WORD LINE

(75) Inventors: Shih-Hung Chen, Hsinchu County (TW); Yen-Hao Shih, New Taipei (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 134 days.

This patent is subject to a terminal disclaimer.

(21) Appl. No.: 13/527,259

(22) Filed: Jun. 19, 2012

(65) Prior Publication Data

US 2013/0334575 A1 Dec. 19, 2013

(51) Int. Cl.
*H01L 21/336* (2006.01)
*H01L 27/115* (2006.01)

(52) U.S. Cl.
CPC .... *H01L 27/11578* (2013.01); *H01L 27/11565* (2013.01)
USPC .............. 438/294; 438/323; 257/E27.07

(58) Field of Classification Search
CPC ............. H01L 27/11578; H01L 27/11551
USPC ............ 438/323, 294; 257/206, E27.07, 257/E27.096
See application file for complete search history.

(56) References Cited

U.S. PATENT DOCUMENTS

| | | |
|---|---|---|
| 4,630,086 A | 12/1986 | Sato et al. |
| 5,286,994 A | 2/1994 | Ozawa et al. |
| 5,319,229 A | 6/1994 | Shimoji et al. |
| 5,851,881 A | 12/1998 | Lin et al. |
| 5,952,692 A | 9/1999 | Nakazato et al. |
| 6,011,725 A | 1/2000 | Eitan |
| 6,026,026 A | 2/2000 | Chan et al. |
| 6,034,882 A | 3/2000 | Johnson et al. |
| 6,074,917 A | 6/2000 | Chang et al. |
| 6,133,603 A | 10/2000 | Nomoto |
| 6,169,693 B1 | 1/2001 | Chan et al. |
| 6,218,700 B1 | 4/2001 | Papadas |
| 6,287,915 B1 | 9/2001 | Muramatsu |
| 6,333,214 B1 | 12/2001 | Kim et al. |

(Continued)

FOREIGN PATENT DOCUMENTS

| | | |
|---|---|---|
| DE | 19929926 A1 | 12/1999 |
| EP | 0016246 A1 | 10/1980 |

(Continued)

OTHER PUBLICATIONS

Paul et al., "Impact of a Process Variation on Nanowire and Nanotube Device Performance," IEEE Trans. on Electron Devices, vol. 54, No. 9, Sep. 2007, pp. 2369-2376.

(Continued)

*Primary Examiner* — Caridad Everhart
(74) *Attorney, Agent, or Firm* — Kenta Suzue; Haynes Beffel & Wolfeld LLP

(57) ABSTRACT

The technology relates to a damascene word line for a three dimensional array of nonvolatile memory cells. Partly oxidized lines of material such as silicon are made over a plurality of stacked nonvolatile memory structures. Word line trenches are made in the partly oxidized lines, by removing the unoxidized lines from the intermediate parts of the partly oxidized lines, leaving the plurality of oxidized lines at the outer parts of the plurality of partly oxidized lines. Word lines are made in the word line trenches over the plurality of stacked nonvolatile memory structures.

19 Claims, 37 Drawing Sheets

(56) References Cited

U.S. PATENT DOCUMENTS

| | | | |
|---|---|---|---|
| 6,455,440 B1 * | 9/2002 | Jeng | 438/770 |
| 6,512,696 B1 | 1/2003 | Fan et al. | |
| 6,531,359 B1 | 3/2003 | Tempel et al. | |
| 6,605,840 B1 | 8/2003 | Wu | |
| 6,657,253 B2 | 12/2003 | Kim et al. | |
| 6,709,928 B1 | 3/2004 | Jenne et al. | |
| 6,713,315 B2 | 3/2004 | Kuo et al. | |
| 6,720,630 B2 | 4/2004 | Mandelman et al. | |
| 6,784,480 B2 | 8/2004 | Bhattacharyya | |
| 6,818,558 B1 | 11/2004 | Rathor et al. | |
| 6,897,533 B1 | 5/2005 | Yang et al. | |
| 6,906,361 B2 | 6/2005 | Zhang | |
| 6,906,940 B1 | 6/2005 | Lue | |
| 6,912,163 B2 | 6/2005 | Zheng et al. | |
| 6,977,201 B2 | 12/2005 | Jung | |
| 7,005,350 B2 | 2/2006 | Walker et al. | |
| 7,075,828 B2 | 7/2006 | Lue et al. | |
| 7,081,377 B2 | 7/2006 | Cleeves | |
| 7,115,469 B1 | 10/2006 | Halliyal et al. | |
| 7,115,942 B2 | 10/2006 | Wang | |
| 7,129,538 B2 | 10/2006 | Lee et al. | |
| 7,133,313 B2 | 11/2006 | Shih | |
| 7,151,692 B2 | 12/2006 | Wu | |
| 7,164,603 B2 | 1/2007 | Shih et al. | |
| 7,177,169 B2 | 2/2007 | Scheuerlein | |
| 7,187,590 B2 | 3/2007 | Zous et al. | |
| 7,190,614 B2 | 3/2007 | Wu | |
| 7,209,390 B2 | 4/2007 | Lue et al. | |
| 7,274,594 B2 | 9/2007 | Pascucci et al. | |
| 7,315,474 B2 | 1/2008 | Lue | |
| 7,382,647 B1 | 6/2008 | Gopalakrishnan | |
| 7,420,242 B2 | 9/2008 | Lung | |
| 7,569,468 B2 | 8/2009 | Chen et al. | |
| 7,851,849 B2 | 12/2010 | Kiyotoshi | |
| 8,199,576 B2 | 6/2012 | Fasoli et al. | |
| 2003/0025147 A1 | 2/2003 | Nomoto et al. | |
| 2003/0030100 A1 | 2/2003 | Lee et al. | |
| 2003/0032242 A1 | 2/2003 | Lee et al. | |
| 2003/0042534 A1 | 3/2003 | Bhattacharyya | |
| 2003/0047755 A1 | 3/2003 | Lee et al. | |
| 2003/0146465 A1 | 8/2003 | Wu | |
| 2003/0224564 A1 | 12/2003 | Kang et al. | |
| 2004/0079983 A1 | 4/2004 | Chae et al. | |
| 2004/0102002 A1 | 5/2004 | Sandhu et al. | |
| 2004/0183126 A1 | 9/2004 | Bae et al. | |
| 2004/0238974 A1 | 12/2004 | Baik | |
| 2004/0256679 A1 | 12/2004 | Hu | |
| 2005/0006696 A1 | 1/2005 | Noguchi et al. | |
| 2005/0023603 A1 | 2/2005 | Eldridge et al. | |
| 2005/0074937 A1 | 4/2005 | Jung | |
| 2005/0093054 A1 | 5/2005 | Jung | |
| 2005/0219906 A1 | 10/2005 | Wu | |
| 2005/0237801 A1 | 10/2005 | Shih | |
| 2005/0237809 A1 | 10/2005 | Shih et al. | |
| 2005/0237813 A1 | 10/2005 | Zous et al. | |
| 2005/0237815 A1 | 10/2005 | Lue et al. | |
| 2005/0237816 A1 | 10/2005 | Lue et al. | |
| 2005/0270849 A1 | 12/2005 | Lue | |
| 2005/0280061 A1 | 12/2005 | Lee | |
| 2005/0281085 A1 | 12/2005 | Wu | |
| 2006/0088983 A1 | 4/2006 | Fujisawa et al. | |
| 2006/0124991 A1 | 6/2006 | Ohba | |
| 2006/0198189 A1 | 9/2006 | Lue et al. | |
| 2006/0198190 A1 | 9/2006 | Lue | |
| 2006/0202252 A1 | 9/2006 | Wang et al. | |
| 2006/0202261 A1 | 9/2006 | Lue et al. | |
| 2006/0258090 A1 | 11/2006 | Bhattacharyya et al. | |
| 2006/0261401 A1 | 11/2006 | Bhattacharyya | |
| 2006/0281260 A1 | 12/2006 | Lue | |
| 2007/0012988 A1 | 1/2007 | Bhattacharyya | |
| 2007/0029625 A1 | 2/2007 | Lue et al. | |
| 2007/0031999 A1 | 2/2007 | Ho et al. | |
| 2007/0045718 A1 | 3/2007 | Bhattacharyya | |
| 2007/0069283 A1 | 3/2007 | Shih et al. | |
| 2007/0140001 A1 | 6/2007 | Motoi et al. | |
| 2007/0253233 A1 | 11/2007 | Mueller et al. | |
| 2008/0073635 A1 | 3/2008 | Kiyotoshi et al. | |
| 2008/0096327 A1 | 4/2008 | Lee et al. | |
| 2008/0101109 A1 | 5/2008 | Haring-Bolivar et al. | |
| 2008/0106931 A1 | 5/2008 | Toda | |
| 2008/0175032 A1 | 7/2008 | Tanaka et al. | |
| 2008/0180994 A1 | 7/2008 | Katsumata et al. | |
| 2008/0247230 A1 | 10/2008 | Lee et al. | |
| 2008/0285350 A1 | 11/2008 | Yeh | |
| 2009/0097321 A1 | 4/2009 | Kim et al. | |
| 2009/0166723 A1 | 7/2009 | Sung et al. | |
| 2009/0184360 A1 | 7/2009 | Jin et al. | |
| 2010/0226195 A1 * | 9/2010 | Lue | 365/230.06 |
| 2010/0270593 A1 | 10/2010 | Lung et al. | |
| 2011/0095353 A1 | 4/2011 | Lue | |
| 2011/0149656 A1 | 6/2011 | Tang et al. | |
| 2012/0007167 A1 | 1/2012 | Hung et al. | |
| 2012/0051137 A1 | 3/2012 | Hung et al. | |
| 2012/0168849 A1 | 7/2012 | Choi et al. | |
| 2012/0181580 A1 | 7/2012 | Lue et al. | |
| 2012/0181599 A1 | 7/2012 | Lung | |
| 2012/0181654 A1 | 7/2012 | Lue | |
| 2012/0181684 A1 | 7/2012 | Lue et al. | |
| 2012/0182801 A1 | 7/2012 | Lue | |
| 2012/0182802 A1 | 7/2012 | Hung et al. | |
| 2012/0182806 A1 | 7/2012 | Chen et al. | |
| 2012/0182807 A1 | 7/2012 | Lue | |
| 2012/0235224 A1 | 9/2012 | Yeh | |
| 2012/0236642 A1 | 9/2012 | Lue | |
| 2012/0327714 A1 | 12/2012 | Lue | |
| 2013/0003434 A1 | 1/2013 | Lue et al. | |
| 2013/0175598 A1 * | 7/2013 | Chen et al. | 257/324 |

FOREIGN PATENT DOCUMENTS

| | | | |
|---|---|---|---|
| EP | 1411555 A2 | 4/2004 | |
| EP | 1936681 A1 | 6/2008 | |
| EP | 2048709 A2 | 4/2009 | |
| JP | 11040682 A | 2/1999 | |
| JP | 2003068893 A | 3/2003 | |
| JP | 2004363329 A | 12/2004 | |
| JP | 2005184029 | 7/2005 | |
| JP | 2005197624 A | 7/2005 | |
| JP | 2006190990 | 7/2006 | |
| KR | 20010056888 A | 7/2001 | |
| KR | 2005011203 * | 1/2005 | H01L 21/28 |
| KR | 20050011203 A | 1/2005 | |

OTHER PUBLICATIONS

Yun et al, "Stacked-nanowire device with virtual source/drain (SD-VSD) for 3D NAND flash memory application," Solid-State Electronics, vol. 64, pp. 42-46 (Jul. 26, 2011).

Yun et al., "Single-Crystalline Si STacked ARray (STAR)," IEEE Trans. Electron. Devices, vol. 58, pp. 1006-1014 (Apr. 2011).

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

(56) References Cited

OTHER PUBLICATIONS

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Fukuzumi et al. "Optimal Integration and Characteristics of Vertical Array Devices for Ultra-High Density, Bit-Cost Scalable Flash Memory," IEEE Dec. 2007, pp. 449-452.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

European Search Report from EP07252779 mailed Nov. 5, 2009, 7 pages.

Aminzadeh et al., "Conduction and Charge Trapping in Polysilicon-Silicon Nitride—Oxide—Silicon Structures under Positive Gate Bias," IEEE Trans. on Electron Dev. 35(4) Apr. 1998 459-467.

Baik, Seung, et al., "High Speed and Nonvolatile Si Nanocrystal Memory for Scaled Flash Technology using Highly Field-Sensitive Tunnel Barrier," IEEE IEDM 03-545 22.3.1-22.3.4.

Blomme et al., "Multilayer tunneling barriers for nonvolatile memory applications," Device Research Conf, 2002 60th DRC Digest 153-154.

Blomme et al., "Write/Erase Cycling Endurance of Memory Cells with SiO2/HfO2 Tunnel Dielectric," IEEE Trans. on Dev. and Mterials Reliability 4(3), Sep. 2004 345-351.

Buckley, J., et al., "Engineering of 'Conduction Band-Crested Barriers' or 'Dielectric Constant-Crested Barriers' in view of their application of floating-gate non-volatile memory devices," VLSI 2004, 55-56.

Chindalore, et al., "A New Combination-Erase Technique for Erasing Nitride Based (SONOS) Nonvolatile Memories," IEEE Electron Dev. Lett. 24(4) Apr. 2003, 257-259.

Cho, et al., "Simultaneous Hot-Hole Injection at Drain and Source for Efficient Erase and Excellent Endurance in SONOS Flash EEPROM Cells," IEEE Electron Device Letters, vol. 24, No. 4, Apr. 2003, 260-262.

DiMaria, D.J., et al., "Conduction Studies in Silicon Nitride: Dark Currents and Photocurrents," IBM J. Res. Dev. May 1977, 227-244.

Eitan, et al., "NROM: A Novel Localized Trapping, 2-Bit Nonvolatile Memory Cell," IEEE Electron Device Lett 21(11) Nov. 2000, 543-545.

Govoreanu et al., "An Investigation of the Electron Tunneling Leakage Current Through Ultrathin Oxides/High-k Gate Stacks at Inversion Conditions," IEEE SISPAD Intl. Conf. Sep. 3-5, 2003 287-290.

Govoreanu et al., "Simulation of Nanofloating Gate Memory with High-k Stacked Dielectrics," IEEE SISPAD Intl. Conf. Sep. 3-5, 2003 299-302.

Govoreanu et al., "VARIOT: A Novel Multilayer Tunnel Barrier Concept for Low-Voltage Nonvolatile Memory Devices," IEEE Electron Dev. Lett. 24(2) Feb. 2003 94-10.

Hijiya, S., et al., "High-Speed Write/Erase EAROM Cell with Graded Energy Band-Gap Insulator," Electronics and Communications in Japan, Part 2, vol. 68, No. 2, Jun. 6, 1984, 28-36.

Hinkle, C.L., et al., "Enhanced tunneling in stacked gate dielectrics with ultra-thin HfO2 (ZrO2) layers sandwiched between thicker SiO2 layers," Surface Science, Sep. 20, 2004, vol. 566-568, 1185-1189.

Ito, et al., "A Novel MNOS Technology Using Gate Hole Injection in Erase Operation for Embedded Nonvolatile Memory Applications." 2004 Symp. on VLSI Tech Dig. of Papers 2004, 80-81.

Kim et al., "Robust Multi-Bit Programmable Flash Memory Using a Resonant Tunnel Barrier," Electron Dev. Mtg. Dec. 5-7, 2005, IEDM Technical Digest 861-864.

Lee, Chang, et al., "A Novel SONOS Structure of SiO2/SiN/Al2O3 with TaN Metal Gate for Multi-Giga Bit Flash Memeries," IEEE 2003, 4 pages.

Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4.

Likharev, "Layered Tunnel Barriers for Nonvolatile Memory Devices," Appl. Phys. Lett. 73(15) Oct. 1998 2137-2139.

Lue et al., "A Novel P-Channel NAND-Type Flash memory with 2-bit/cell Operation and High Programming Throughput (>20 MB/sec)," IEEE 2005, 4 pages.

Lue et al., "BE-SONOS: A Bandgap Engineered SONOS with Excellent Performance and Reliability," IEDM Tech. Digest Dec. 2005 547-550.

Minami, et al., "New Scaling Guidelines for MNOS Nonvolatile Memory Devices," IEEE Trans on Electron Devices 38 (11) Nov. 1991 2519-2526.

Shih et al., "A Novel 2-bit/cell Nitride Storage Flash Memory with Greater than 1M P/E-cycle Endurance," IEEE IEDM 2004 881-884 (36.3.1-36.3.4).

Sung et al., "Multi-Layer SONOS with Direct Tunnel Oxide for High Speed and Long Retention Time," IEEE Silicon Nanoelectronics Workshop Jun. 2002 83-84.

Takata, M., et al., "New Non-Volatile Memory with Extremely High Density Metal Nano-Dots," IEEE IEDM 03-553, 22.5.1-22.5.4.

Walker et al., "3D TFT-SONOS Memory Cell for Ultra-High Density File Storage Applications," 2003 Symposium on VLSI Tech Digest of Technical Papers, 29-30.

White et al., "On the Go with SONOS" IEEE Circuits and Devices, Jul. 2000, 22-31.

Yamada et al., "A self-convergence erasing scheme for a simple stacked gate flash EEPROM," Proc. Int'l. Electron Devices Meeting, Dec. 1991 307-310.

Yeh, C.C., et al., "PHINES: A Novel Low Power Program/Erase, Small Pitch, 2-Bit per Cell Flash Memory," IEDM Tech Digest 2002, 931-934.

Tsai et al., "Novel SONOS-Type Nonvolatile Memory Device with Suitable Band Offset in HfAlO Charge-Trapping Layer," Int'l Symp. on VLSI Tech, Systems and Applications, Apr. 23-25, 2007, 2 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Wen, Huang-Chun, et al., "Issues associated with p-type band-edge effective work function metal electrodes: Fermi-level pinning and flatband roll-off," In'l Symp on VLSI Technology, Systems and Applications, Apr. 23-25, 2007, 2 pages.

Padilla, Alvaro, et al., "Dual-bit SONOS FinFET Non-Volatile Memory Cell and New Method of Charge Detection," Int'l Symp on VLSI Technology, Systems and Applications, Apr. 23-25, 2007, 2 pages.

Wu, W.-C., et al., "Highly Reliable Multilevel and 2-bit/cell Operation of Wrapped Select Gate (WSG) SONOS Memory," IEEE Electron Device Letters, vol. 28, Issue 3, Mar. 2007, 214-216.

(56) References Cited

OTHER PUBLICATIONS

Maikap, S., et al., "High-k HfO2/TiO2/HfO2 multilayer quantum well flash memory devices," Int'l Symp on VLSI Technology, Sytems and Applications Apr. 23-25, 2007, pp. 1-2.

Kim, Moon Kyung, et al., "The Effects of ONO thickness on Memory Characteristics in Nano-scale Charge Trapping Devices," Int'l Symp on VLIS Technology, Systems and Applications, Apr. 23-25, 2007, pp. 1-2.

Lai, Sheng-Chih, et al., "A Study on the Erase and Retention Mechanisms for MONOS, MANOS, and BE-SONOS Non-Volatile Memory Devices," Int'l Symp on VLSI Technology, Systems and Applications, Apr. 23-25, 2007, pp. 1-2.

Office Action mailed Nov. 23, 2007 in U.S. Appl. No. 11/197,668.

Office Action mailed Oct. 19, 2007 in U.S. Appl. No. 11/324,495.

U.S. Appl. No. 13/347,331, filed Jan. 10, 2012, Shih-Hung Chen, et al., "Damascene Word Line," 57 pp.

* cited by examiner

109 BL Pad Structure

112 Semiconductor Strip

109
BL Pad
Structure

112
Semiconductor
Strip

DAMASCENE WORD LINE

BACKGROUND OF THE INVENTION

1. Field of the Invention

The present invention relates to high density memory devices, and particularly to memory devices in which multiple planes of memory cells are arranged to provide a three-dimensional memory array.

2. Description of Related Art

In an example three-dimensional memory array, multiple ridges each include alternating stacks of semiconductor strips and oxide strips, and the ridges are covered by charge storage layers such as polysilicon or charge trapping dielectric material like ONO. Word lines orthogonal to and conformal to the ridges access the memory cells in the three-dimensional memory array. Insulating lines, such as oxide lines orthogonal to and conformal to the ridges, electrically isolate the neighboring word lines from each other.

However, it is not trivial to form the oxide lines between the word lines such that neighboring word lines are electrically isolated from each other by the oxide lines. FIGS. 1-2 show problems in various manufacturing processes for the word lines and the oxide lines of a three-dimensional memory array.

FIG. 1 is a perspective illustration of a three dimensional memory array device, where the polysilicon word lines are formed prior to the oxide lines separating the word lines, and polysilicon residue forms an undesirable bridge electrically connecting neighboring word lines.

Semiconductor strips 11, 13, and 15 are separated by oxide strips 10, 12, 14, and 16. The stacks of alternating semiconductoroxide strips are covered by charge storage layers 26, such as ONO or ONONO. The polysilicon word line 55 is formed by covering the stacks of alternating semiconductor-oxide strips and charge storage layers with polysilicon, and etching away excess polysilicon between neighboring polysilicon word lines to form trenches between neighboring polysilicon word lines. After etching away the excess polysilicon, oxide lines are formed that isolate neighboring polysilicon word lines.

A high aspect ratio is presented by the height of the stacks of alternating semiconductoroxide strips covered by charge storage layers, relative to the desired distance between neighboring word lines. As a result, there is a failure to etch away polysilicon residue 56. Despite the following oxide fill in the trenches formed by the polysilicon etch, the polysilicon residue 56 electrically connects neighboring word lines (the word line shown in the figure, and a neighboring word line not shown in the figure).

The charge storage layers fill part of the oxide void in the stack of alternating semiconductoroxide strips, which is a region 27 of oxide pull-back. Oxide pull-back was caused by cleaning the stacks of alternating semiconductoroxide strips, in preparation for making the charge storage layers. The region 27 of oxide pull-back in turn results in a void in the charge storage layers. This void is filled by polysilicon residue 57, which electrically connects neighboring word lines (the word line shown in the figure, and another neighboring word line not shown in the figure).

FIG. 2 is a perspective illustration of a three dimensional memory array device, where the oxide lines are formed prior to the polysilicon word lines, and an oxide void allows polysilicon residue to form an undesirable bridge electrically connecting neighboring word lines.

Semiconductor strips 11, 13, 15 are separated by oxide strips 10, 12, 14, 16. The stacks of alternating semiconductoroxide strips are covered by charge storage layers, such as a charge storage structure of an oxide 20-nitride 21-oxide 22. The oxide line 45 is formed by covering the stacks of alternating semiconductoroxide strips and charge storage layers with oxide, and etching away excess oxide between neighboring oxide lines to form trenches between neighboring oxide lines. After etching away the excess oxide, damascene polysilicon word lines are formed in the trenches between neighboring oxide lines.

Oxide line 45 has a void 46. In the step of making polysilicon word lines in the trenches between neighboring oxide lines, the oxide void 46 is filled with polysilicon, electrically connecting the neighboring polysilicon word lines on either side of the oxide line 45.

An additional problem is the quality of the charge storage layers covering the alternating stacks of semiconductor strips and oxide strips. When the charge storage layers are formed prior to the word lines and oxide lines, and the oxide lines are formed prior to the word lines, the oxide lines are formed by etching away excess oxide between the oxide lines to form trenches for the word lines. However, after the oxide etch removes excess oxide, the oxide etch damages the charge storage layers under the excess oxide. This damage to the charge storage layers harms memory device performance. For charge storage layers with an outer oxide such as ONO, it is difficult to selectively etch the excess oxide but not the outer oxide of the charge storage layers.

FIG. 3 is a top view of a three dimensional memory array device, where the ONO storage layers are formed after the oxide lines but prior to the polysilicon word lines, resulting in larger dimensions of the array. The process flow shows: (i) formation of the stacks of alternating oxidesemiconductor strips 18, (ii) formation of oxide lines 42 orthogonal and conformal to the oxidesemiconductor strips, and (iii) formation of charge storage layers 28 such as ONO or polysilicon. The charge storage layers can cover the stacks of alternating oxidesemiconductor strips 18. The figure does not show the charge storage layers can cover the stacks of alternating oxidesemiconductor strips 18, so that the lateral dimensions of the storage layers are visible. This process flow is disadvantageous, because the unit cell size is laterally enlarged by twice the thickness of the storage layers.

U.S. application Ser. No. 12347,331 filed 10 Jan. 2012 describes a damascene word line. The present application describes additional technology regarding a damascene word line. Several embodiments in U.S. application Ser. No. 12347,331 have a relatively shorter process flow. Several embodiments of the present application can be scaled down to a relatively smaller word line pitch, or relatively smaller distance between neighboring word lines.

It is desirable to provide a structure for three-dimensional integrated circuit memory with a low manufacturing cost, including reliable, very small memory elements and improved process window associated with neighboring stacks of memory cell strings having gate structures.

SUMMARY OF THE INVENTION

Technology is described here that includes a method of making a three dimensional array of nonvolatile memory cells. The method includes the following:

A first plurality of material lines is made over a plurality of stacked nonvolatile memory structures. The first plurality of material lines are separated by a first plurality of word line trenches that separate neighboring ones of the first plurality of material lines. In some embodiments of the described technology, to form the first plurality of material lines, a layer of material such as silicon is made over the plurality of stacked nonvolatile memory structures, and excess material such as silicon is removed from the layer to leave the first plurality of material lines and form the first plurality of word line trenches between neighboring ones of the first plurality of material lines.

A plurality of partly oxidized structures is made from the first plurality of material lines by oxidizing both sides of material lines in the first plurality of material lines. The plurality of partly oxidized structures include a plurality of oxide lines bounding a first plurality of narrowed material lines. Narrowed material lines in the first plurality of narrowed material lines have a narrower width than the material lines in the first plurality of material lines.

The first plurality of narrowed material lines bounded by the plurality of oxide lines are removed, to make a second plurality of word line trenches.

A plurality of word lines is made over the plurality of stacked nonvolatile memory structures in the first plurality of word line trenches and the second plurality of word line trenches.

In some embodiments of the described technology, the material lines include silicon lines. In some embodiments of the described technology, the silicon lines include at least one of amorphous silicon, polysilicon, and single crystal silicon. The polysilicon material used in this paper can be replaced by other silicon such as amorphous silicon or single crystal silicon.

In other embodiments of the described technology, the material lines include metal lines such as W which oxidizes to WOx. Successful oxidation of a metal line to an insulating oxide is process dependent, and varies with the oxygen concentration.

In yet other embodiments of the described technology, the material lines include semiconductor lines.

Several embodiments of the described technology can repair the damage to charge storage layers which results from etching. After removing the first plurality of narrowed material lines covering the plurality of stacked nonvolatile memory structures, exposed oxide is etched, which is covering the plurality of stacked nonvolatile memory structures in the second plurality of word line trenches. In some embodiments, the exposed oxide is etched until exposing nitride covering the plurality of stacked nonvolatile memory structures in the second plurality of word line trenches. Such etching of the exposed oxide can remove damaged oxide that would otherwise harm memory device performance. The etched oxide is replaced with new oxide. Oxide is made to cover the plurality of stacked nonvolatile memory structures in the second plurality of word line trenches. This replacement oxide for the etched exposed oxide can result in superior memory device performance. In various embodiments, the oxide can be deposited, andor oxidized from an exposed nitride layer covering the plurality of stacked nonvolatile memory structures in the second plurality of word line trenches.

In some embodiments of the described technology, before removing the first plurality of narrowed material lines covering the plurality of stacked nonvolatile memory structures, a second plurality of material lines is made in the first plurality of word line trenches. Prior to making the word lines in the first plurality of word line trenches, the second plurality of material lines are removed from the first plurality of word line trenches, at least partly while removing the first plurality of narrowed material lines. Subsequent to removing the material lines from the word line trenches, the word lines can be made in the word line trenches.

In some embodiments of the described technology, removing the first plurality of narrowed material lines leaves material such as silicon residue in at least one word line trench of the second plurality of word line trenches. After removing the first plurality of narrowed material lines, material such as silicon residue left in at least one word line trench of the second plurality of word line trenches is oxidized.

In some embodiments of the described technology, an oxide line of the plurality of oxide lines has a void. After removing the first plurality of narrowed material lines, to at least partly fill the void, material such as silicon residue left in at least one word line trench of the second plurality of word line trenches is oxidized.

In some embodiments of the described technology, making the word lines is a damascene process.

In some embodiments of the described technology, prior to oxidizing both opposite sides including first surfaces and second surfaces of the material lines in the first plurality of material lines, oxidation masks are made that cover third surfaces of the material lines in the first plurality of material lines. The third surfaces joining the first surfaces and the second surfaces of the material lines. The oxidation masks can decrease oxidation of the third surfaces while oxidizing the first surfaces and the second surfaces. In some embodiments, material such as silicon is deposited over the oxidation masks at least partly while filling in the first plurality of word line trenches with material such as silicon. After oxidizing the first surfaces and the second surfaces, the oxidation masks can be removed. The third surfaces can be top surfaces with decreased oxidation due to the oxidation masks covering the third surfaces. After removing the oxidation masks, the material such as silicon can be removed from the first plurality of word line trenches at least partly while removing the first plurality of narrowed material lines.

In some embodiments of the described technology, prior to making the first plurality of word line trenches, the plurality of stacked nonvolatile memory structures are formed, including a plurality of semiconductor strips separated by insulating material, and charge storage structures covering the plurality of semiconductor strips. The charge storage structures can include a silicon nitride layer. Also, the charge storage structures can include an oxide-nitride-oxide-nitride-oxide structure (such as BE-SONOS). In one example, the charge storage structures include a hafnium oxide layer. In yet another example, charge storage structures covering the plurality of semiconductor strips, the charge storage structures include a dielectric layer having a dielectric constant greater than a silicon oxide dielectric constant, also called a high-K layer.

Further technology described here is an additional method of making a three dimensional array of nonvolatile memory cells. The method includes the following:

A plurality of partly oxidized silicon lines are formed over a plurality of stacked nonvolatile memory structures. The plurality of partly oxidized silicon lines have a plurality of unoxidized silicon lines at intermediate parts of the plurality of partly oxidized lines and a plurality of oxidized lines at outer parts of the plurality of partly oxidized lines.

A plurality of word line trenches is made in the plurality of partly oxidized silicon lines, by removing the plurality of unoxidized silicon lines from the intermediate parts of the plurality of partly oxidized lines, leaving the plurality of oxidized lines at the outer parts of the plurality of partly oxidized lines.

A plurality of word lines is made in the plurality of word line trenches over the plurality of stacked nonvolatile memory structures.

In some embodiments of the described technology, after removing the plurality of unoxidized silicon lines over the plurality of stacked nonvolatile memory structures, exposed oxide covering the plurality of stacked nonvolatile memory structures in the plurality of word line trenches is etched. Oxide is made to cover the plurality of stacked nonvolatile memory structures in the plurality of word line trenches.

In some embodiments of the described technology, forming the plurality of partly oxidized silicon lines over the plurality of stacked nonvolatile memory structures includes, the steps of:

- making oxidation masks covering top surfaces of silicon lines in a plurality of silicon lines over the plurality of stacked nonvolatile memory structures; and
- oxidizing both opposite exposed surfaces of the silicon lines in the plurality of silicon lines.

Further technology described here is an integrated circuit with a three dimensional array of nonvolatile memory cells. The integrated circuit includes a plurality of double patterned word lines; a plurality of oxide lines separating neighboring ones of the plurality of word lines; and a plurality of stacked nonvolatile memory structures in the three dimensional array. The double patterned word lines follow multiple patterning steps, or multiple exposures and multiple etch steps.

The plurality of stacked nonvolatile memory structures are covered by the plurality of word lines and the plurality of oxide lines. The plurality of stacked nonvolatile memory structures include a nitride layer. The plurality of stacked nonvolatile memory structures include a first part covered by the plurality of word lines and a second part covered by the plurality of oxide lines. The nitride layer in the first part has a narrower thickness than the nitride layer in the second part.

Further embodiments of the various technologies are described herein.

Other aspects and advantages of the present invention can be seen on review of the drawings, the detailed description and the claims, which follow.

DETAILED DESCRIPTION

Figure 4:
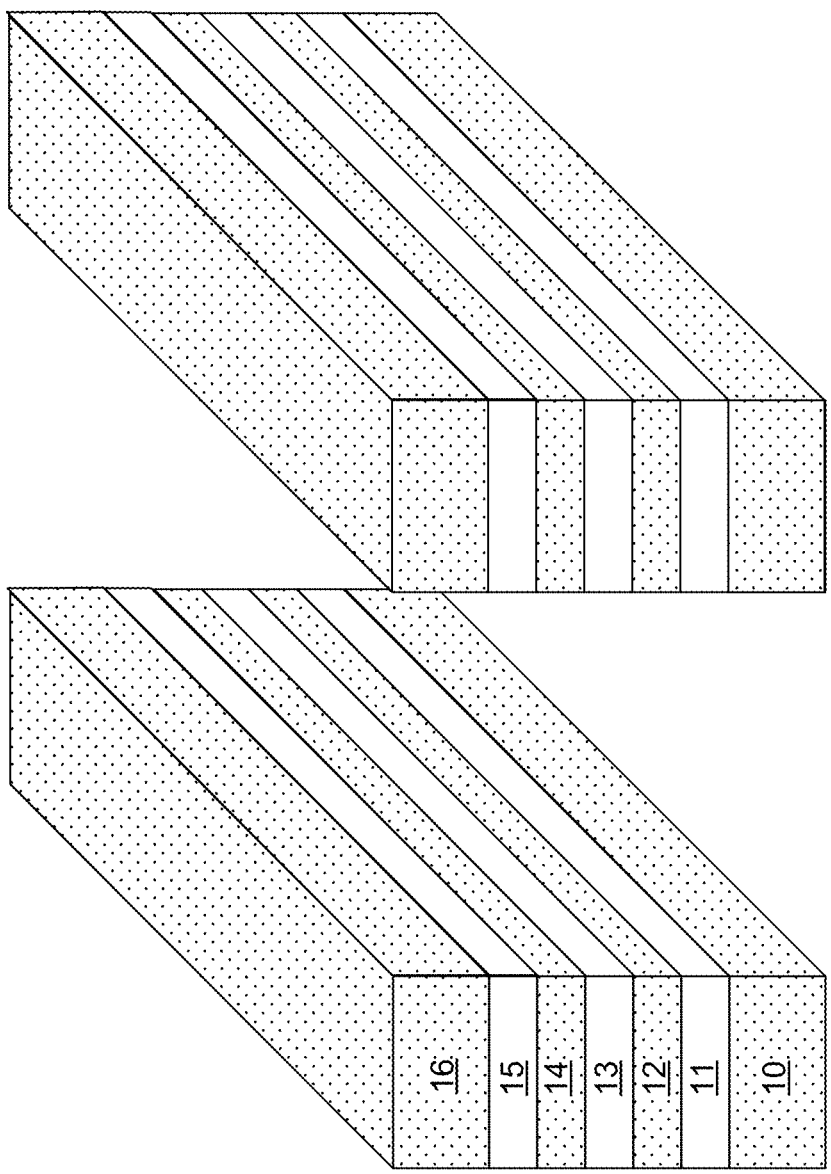
FIG. 4 illustrates part of a process for manufacturing a memory device, and shows a perspective illustration of forming a plurality of parallel semiconductor strips separated by oxide strips, arranged in a plurality of ridge-shaped stacks.

FIG. 4 illustrates part of a process for manufacturing a memory device, and shows a perspective illustration of forming a plurality of parallel semiconductor strips separated by oxide strips, arranged in a plurality of ridge-shaped stacks.

In FIG. 4, only 3 layers of semiconductor strips are shown for purposes of illustration. However, the number of layers can be extended to other numbers such as 2 layers, 4 layers, 8 layers, 16 layers, or another number of layers. The memory array is formed on an integrated circuit substrate having an insulating layer over underlying semiconductor or other structures (not shown). The memory array includes a plurality of stacks (2 stacks are shown in the figure) of semiconductor strips 11, 13, and 15 alternating with insulating material strips 10, 12, 14, and 16. The stacks are ridge-shaped extending on the Y-axis as illustrated in the figure, so that the semiconductor strips 11, 13, 15 can be configured as memory cell strings. Semiconductor strips at the same height can act as memory cell strings in a same memory plane.

To make the stacks of strips, in one example semiconductor layers alternating with insulating material layers are formed for example in blanket deposition in the array area of the chip. The semiconductor strips are implemented using the semiconductor layers separated by the insulating layers. FIG. 4 shows the result of a lithographic patterning step used to define a plurality of ridge-shaped stacks of semiconductor strips. Deep, high aspect ratio gaps can be formed between the stacks, supporting many layers, using lithography based processes applying a carbon hard mask and reactive ion etching.

The semiconductor strips 11, 13, 15 can be a p-type semiconductor material. For example, the semiconductor strips can be made using p-type polysilicon, or p-type epitaxial single crystal silicon.

Alternatively, the semiconductor strips 11, 13, 15 can be n-type semiconductor material. An n-type strip arrangement can result in buried-channel, depletion mode charge trapping dielectric material memory cells. For example, the semiconductor strips 11, 13, 15 can be made using n-type polysilicon, or n-type epitaxial single crystal silicon. A typical doping concentration for n-type semiconductor strips can be around $10^{18} cm^3$, with usable embodiments likely in the range of $10^{17} cm^3$ to $10^{19} cm^3$. The use of n-type semiconductor strips can be particularly beneficial in junction-free embodiments to improve conductivity along the NAND strings and thereby allowing higher read current.

Inter-level insulating strips 10, 12, 14, 16 can be implemented for example using silicon dioxide, other silicon oxides, or silicon nitride. These layers can be formed in a variety of ways, including low pressure chemical vapor deposition LPCVD processes.

The insulating material 12 between the semiconductor strips 11 and 13, and the insulating material 14 between semiconductor strips 13 and 15, and the insulating material in corresponding insulating material strips in other stacks, has an effective oxide thickness of about 30 nm or greater, where effective oxide thickness EOT is a thickness of the insulating material normalized according to a ratio of the dielectric constant of silicon dioxide and the dielectric constant of the chosen insulation material. The term "about 30 nm" is used here to account for variations on the order of 10% or so, as arise typically in manufacturing structures of this type. The thickness of the insulating material can play a critical role in reducing interference between cells in adjacent layers of the structure. In some embodiments, the EOT of the insulating material can be as small as 20 nm while achieving sufficient isolation between the layers of semiconductor strips.

Figure 5:
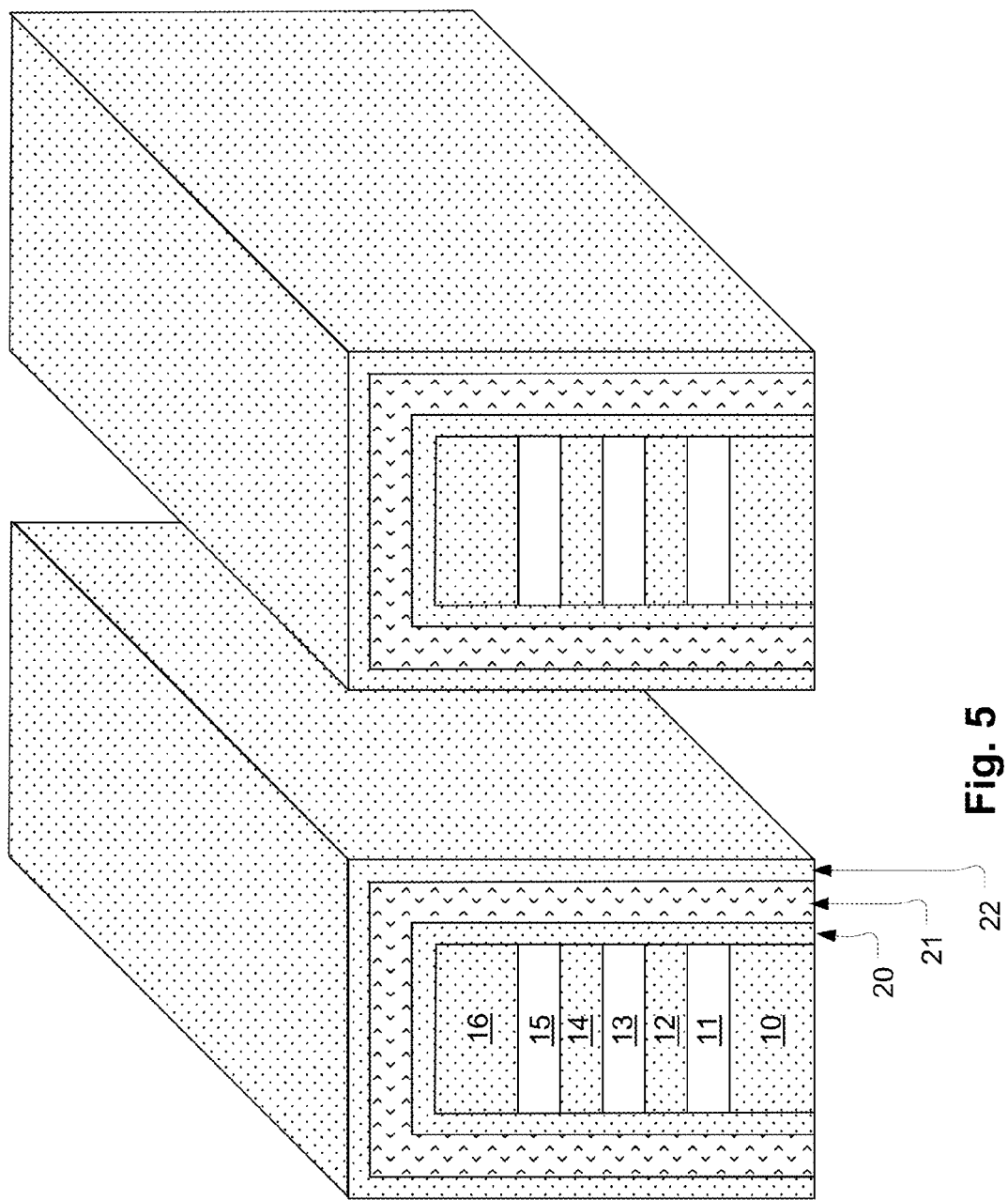
FIG. 5 illustrates part of a process for manufacturing a memory device, and is a perspective illustration of forming oxide-nitride-oxide data storage layers on the plurality of ridge-shaped stacks of FIG. 4.

FIG. 5 illustrates part of a process for manufacturing a memory device, and is a perspective illustration of forming oxide-nitride-oxide data storage layers on the plurality of ridge-shaped stacks of FIG. 4.

The data storage layers can include a dielectric charge trapping structure. Shown are the results of blanket deposition of data storage layers oxide 22 (blocking dielectric layer)-nitride 21 (charge storage layer)-oxide 20 (tunneling dielectric layer), which conformally coat the plurality of stacks of semiconductor strips in this example.

The layer(s) of memory material can comprise other charge storage structures. For example, a bandgap engineered SONOS (BE-SONOS) charge storage structure can be used which includes a dielectric tunneling layer that includes a composite of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer in this embodiment comprises silicon dioxide on the side surface of the semiconductor strips formed for example using in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

The band offset layer in this embodiment comprises silicon nitride lying on the hole tunneling layer, formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The band offset layer thickness of silicon nitride is less than 30 Å, and preferably 25 Å or less.

The isolation layer in this embodiment comprises silicon dioxide, lying on the band offset layer of silicon nitride formed for example using LPCVD high temperature oxide HTO deposition. The thickness of the isolation layer of silicon dioxide is less than 35 Å, and preferably 25 Å or less. This three-layer tunneling layer results in an inverted U-shaped valence band energy level.

The valence band energy level is such that an electric field sufficient to induce hole tunneling through the thin region at the interface with the semiconductor body, is also sufficient to raise the valence band energy level to a level that effectively eliminates the hole tunneling barrier in the composite tunneling dielectric. This structure establishes an inverted U-shaped valence band energy level in the three-layer tunneling dielectric layer, and enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

In a representative device, the layer of memory material includes a bandgap engineered composite tunneling dielectric layer comprising a layer of silicon dioxide less than 2 nm thick, a layer of silicon nitride less than 3 nm thick, and a layer of silicon dioxide less that 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping dielectric layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

A charge trapping dielectric layer in the layer of memory material in this embodiment comprises silicon nitride having a thickness greater than 50 Å, including for example about 70 Å in this embodiment formed for example using LPCVD. Other charge trapping dielectric materials and structures may be employed, including for example silicon oxynitride ($Si_x$-$O_yN_z$), silicon-rich nitride, silicon-rich oxide, trapping layers including embedded nano-particles and so on.

The blocking dielectric layer in the layer of memory material in this embodiment comprises a layer of silicon dioxide having a thickness greater than 50 Å, including for example about 90 Å in this embodiment, can be formed by wet conversion from the nitride by a wet furnace oxidation process. Other embodiments may be implemented using high temperature oxide (HTO) or LPCVD $SiO_2$. Other blocking dielectrics can include high-K materials like aluminum oxide.

In a representative embodiment, the hole tunneling layer can be 13 Å of silicon dioxide; the band offset layer can be 20 Å of silicon nitride; the isolation layer can be 25 Å of silicon dioxide; the charge trapping dielectric layer can be 70 Å of silicon nitride; and the blocking dielectric layer can be silicon oxide 90 Å thick. The gate material can be p+ polysilicon (work function about 5.1 eV) used in the word line 50 shown in later figures.

The outer oxide 22 in FIG. 5 is a sacrificial oxide, to be removed and regrown later.

Figure 6:
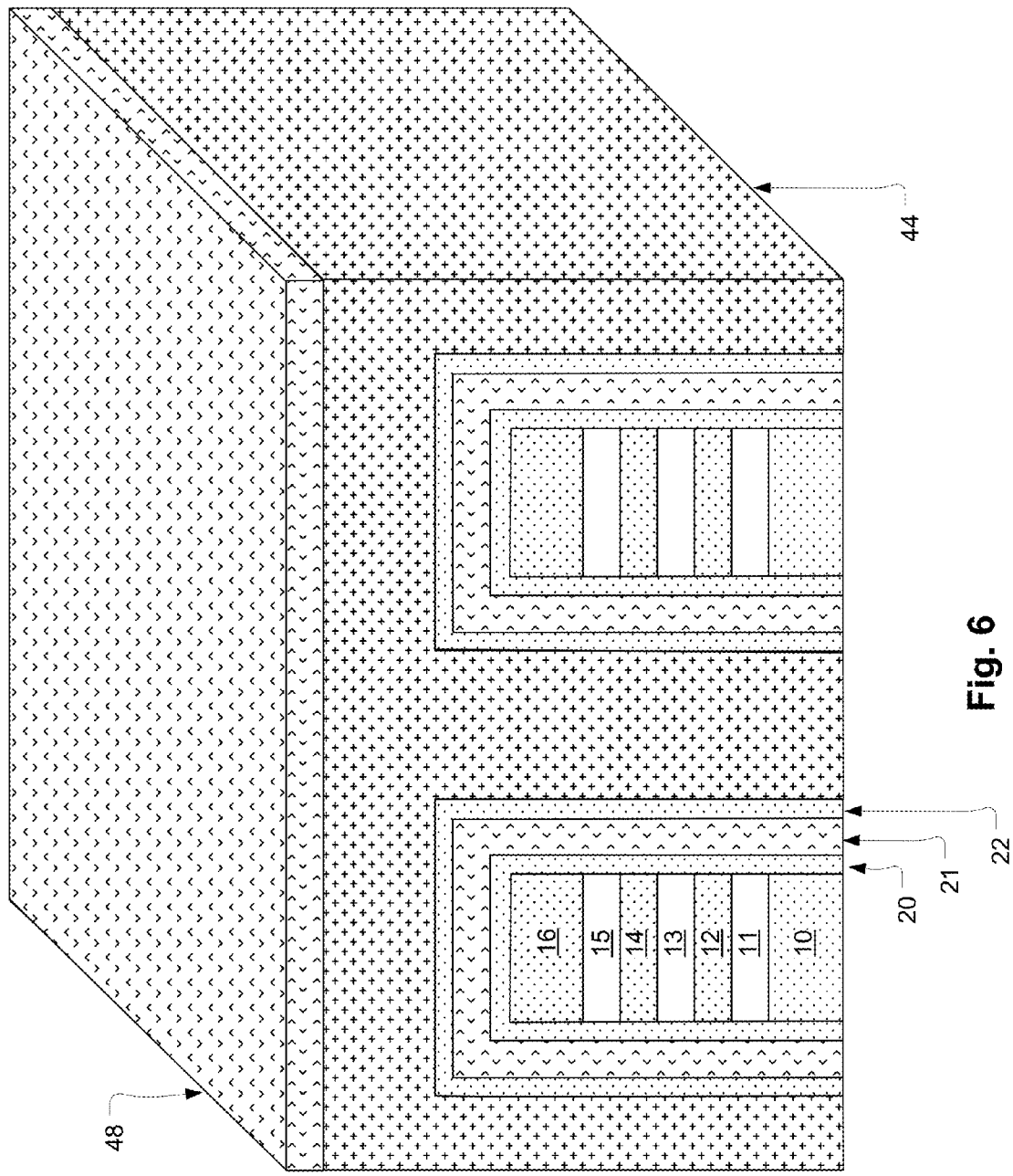
FIG. 6 illustrates part of a process for manufacturing a memory device, and is a perspective illustration of forming an oxide and polysilicon, with conformal bottom surfaces arranged over the plurality of ridge-shaped stacks of FIG. 5.

FIG. 6 illustrates part of a process for manufacturing a memory device, and is a perspective illustration of forming an oxide and polysilicon, with conformal bottom surfaces arranged over the plurality of ridge-shaped stacks of FIG. 5.

The polysilicon material 44 is formed conformally over the data storage layers covering the plurality of stacks of semiconductor strips. The polysilicon material 44 fills the gaps between the plurality of stacks of semiconductor strips.

In a high aspect ratio fill step, conductive material, such as polysilicon having n-type or p-type doping, is deposited to cover the stacks of semiconductor material strips and fill the gaps between the stacks of semiconductor material strips. High aspect ratio deposition technologies such as low-pressure chemical vapor deposition of polysilicon is utilized to completely fill the gaps 220 between the ridge-shaped stacks, even very narrow trenches on the order of 10 nanometers wide with high aspect ratio.

A dielectric layer 48 can be a silicon nitride film as shown, silicon dioxide, or other silicon oxides. This dielectric layer can be formed in a variety of ways, including a low pressure chemical vapor deposition LPCVD processes. The dielectric layer 48 discourages diffusion of oxidizing species such as oxygen and water from diffusing through the oxidation layer 48.

Figure 7:
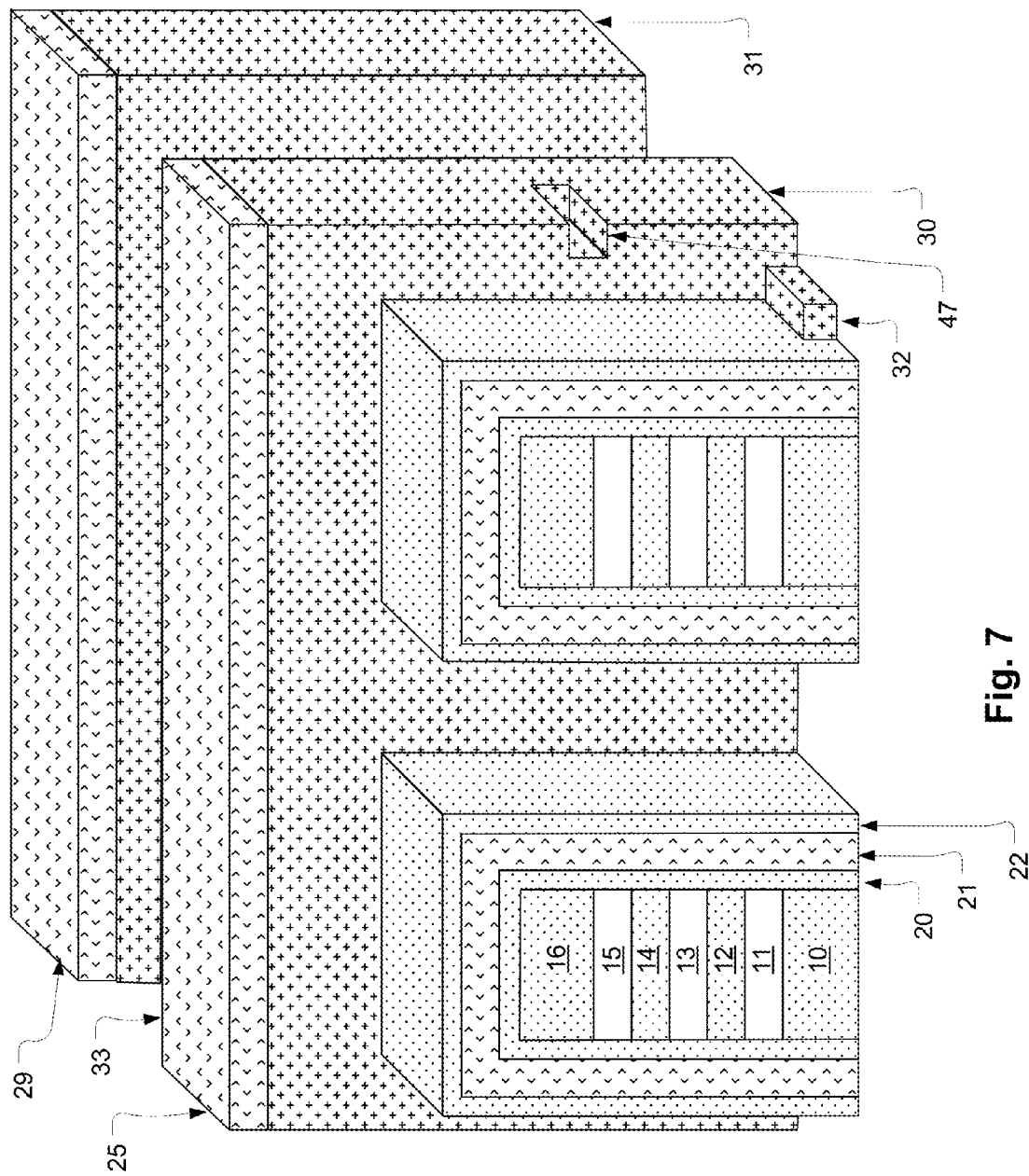
FIG. 7 illustrates part of a process for manufacturing a memory device, and is a perspective illustration of forming polysilicon lines with oxidation masks from the polysilicon and dielectric layers of FIG. 6.

FIG. 7 illustrates part of a process for manufacturing a memory device, and is a perspective illustration of forming polysilicon lines with oxidation masks from the polysilicon and dielectric layers of FIG. 6.

In a lithographic patterning step, the polysilicon lines 30 and 31 are defined from polysilicon layer 44. In one representative embodiment, the width of the polysilicon lines is anywhere from 500-1500 angstroms, though this is dependent on specifics of future steps and the desired ultimate width of word lines and spacing between word lines. The lithographic patterning step utilizes a mask for critical dimensions of the array for etching high aspect ratio trenches between the polysilicon lines such as trench 33, without etching through the ridge-shaped stacks. The high aspect ratio word line trenches separate the polysilicon lines formed in this step, and indicate where the word lines will be formed in a future step, though the word line trenches are narrowed in a future step. Polysilicon can be etched using an etch process that is highly selective for polysilicon over silicon oxides or silicon nitrides. Thus, alternating etch processes are used, relying on the same mask to etch through the conductor and insulating layers, with the process stopping on an underlying insulating layer. Despite the highly selective etch, during the etch there is oxide loss from exposed oxide such as the outer oxide 22. Such oxide loss varies with position. Oxide 22 is a dummy oxide that later is etched and regrown in subsequent processing discussed below. The oxide 22 protects the SiN memory kernel 21.

The polysilicon lines 30 and 31 are formed conformally over the data storage layers covering the plurality of stacks of semiconductor strips. The polysilicon lines 30 and 31 fill the gaps between the plurality of stacks of semiconductor strips. Two polysilicon lines 30 and 31 are shown, but other embodiments have a different number of polysilicon lines. Additional polysilicon lines are formed along the y-axis out of the page and into the page. Neighboring polysilicon lines are separated by a word line trench, such as trench 33, narrowed in a future step.

In the same lithographic patterning step that defined polysilicon lines 30 and 31, the oxidation masks 25 and 29 are defined from dielectric layer 48. The oxidation masks 25 and 29 discourage diffusion of oxidizing species such as oxygen and water from diffusing through the oxidation masks. Thus, the oxidation masks 25 and 29 discourage oxidation of the top surfaces of the underlying polysilicon lines 30 and 31.

The polysilicon residue 32 in FIG. 7 creates a risk of forming a conductive bridge electrically connecting neighboring word lines. The polysilicon residue 32 is oxidized in FIG. 8, removing the risk that the residue 32 shorts together neighboring word lines. The polysilicon line 31 also has a void 47.

Figure 8:
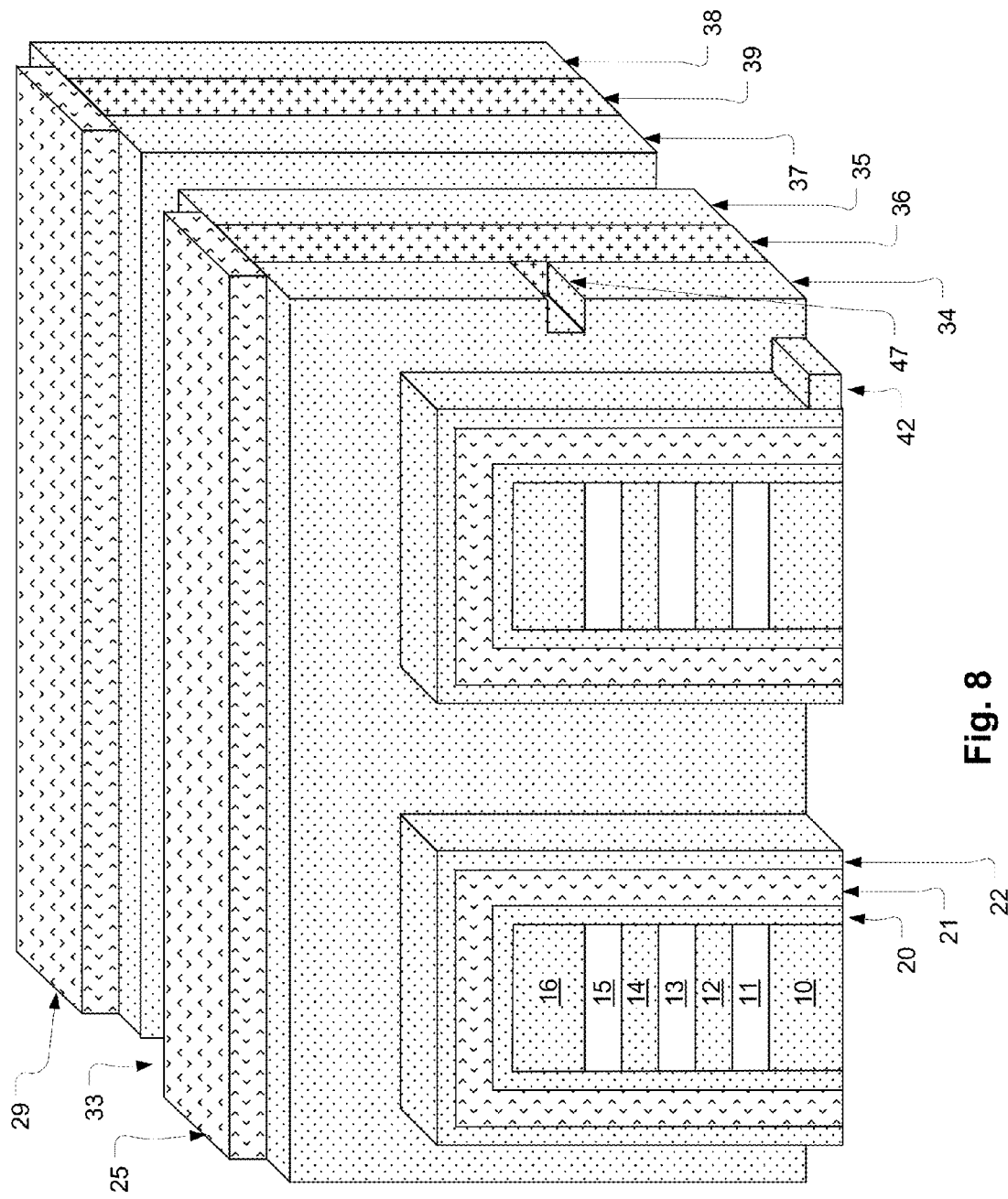
FIG. 8 illustrates part of a process for manufacturing a memory device, and is a perspective illustration of forming oxide lines via oxidation, with conformal bottom surfaces arranged over the plurality of ridge-shaped stacks, from the conformal polysilicon lines of FIG. 7.

FIG. 8 illustrates part of a process for manufacturing a memory device, and is a perspective illustration of forming oxide lines via oxidation, with conformal bottom surfaces arranged over the plurality of ridge-shaped stacks, from the conformal polysilicon lines of FIG. 6. During the oxidation process which forms the oxide lines, from the polysilicon surfaces, the polysilicon residue 32 is also oxidized.

The conformal polysilicon lines 30 and 31 are partly oxidized. Both opposite exposed surfaces of conformal polysilicon line 30 are oxidized, forming oxide lines 34 and 35 on both opposite sides of narrowed polysilicon line 36. Both opposite exposed surfaces of conformal polysilicon line 31 are oxidized, similarly forming oxide lines 37 and 38 on both opposite sides of a narrowed polysilicon line 39. However, the oxidation masks 25 and 29 discourage oxidation from the top surfaces of the conformal polysilicon lines 30 and 31 covered by the oxidation masks 25 and 29. Oxide lines 34, 35, 37, and 38 are conformal over the data storage layers covering the plurality of stacks of semiconductor strips, and fill the trenches defined by the plurality of stacks of semiconductor strips. Other embodiments have a number of oxide lines that are sufficient to isolate the number of word lines that access the array. Additional oxide lines are formed along the y-axis out of the page and into the page. This oxidation narrows the trench 33 between oxide lines 35 and 37, because of the expansion of polysilicon into silicon oxide. An example thickness range of oxide lines 34, 35, 37, and 38 is about 400 angstroms down to about 100 angstroms. After the oxidation, the narrowed polysilicon lines have an example thickness of about 350 angstroms down to about 100 angstroms.

Example oxidation processes are furnace oxidation such as with horizontal furnaces and vertical furnaces, and rapid thermal processors (RTP).

The oxidation process of FIG. 8 addresses issues with polysilicon polysilicon residue, as shown in the following figures. The amount of material in the polysilicon line is a limiting source on the oxidation process. In the reaction, Si (from the polysilicon line)+$O_2$ forms $SiO_2$. The volume of the resulting $SiO_2$ expands by over 120% over the reacted Si source. In terms of volume percentages where the resulting $SiO_2$ has a volume of 100%, then Si (solid, volume 45%)+$O_2$ (gas) forms $SiO_2$ (Solid, volume 100%). So the volume expansion of silicon to silicon oxide is 55/45 or about 122% due to oxidation. Small voids in the outer surfaces of polysilicon lines 30 and 31 are filled in the oxidation process.

The polysilicon residue 32 of FIG. 7 is oxidized into silicon oxide 42 during the process of oxidizing both opposite sides of polysilicon lines 30 and 31. Such oxidation reduces the risk of a conductive bridge electrically connecting neighboring word lines. The oxide line 34 also has a void 47, which was formerly a void in the polysilicon line 30.

Figure 9:
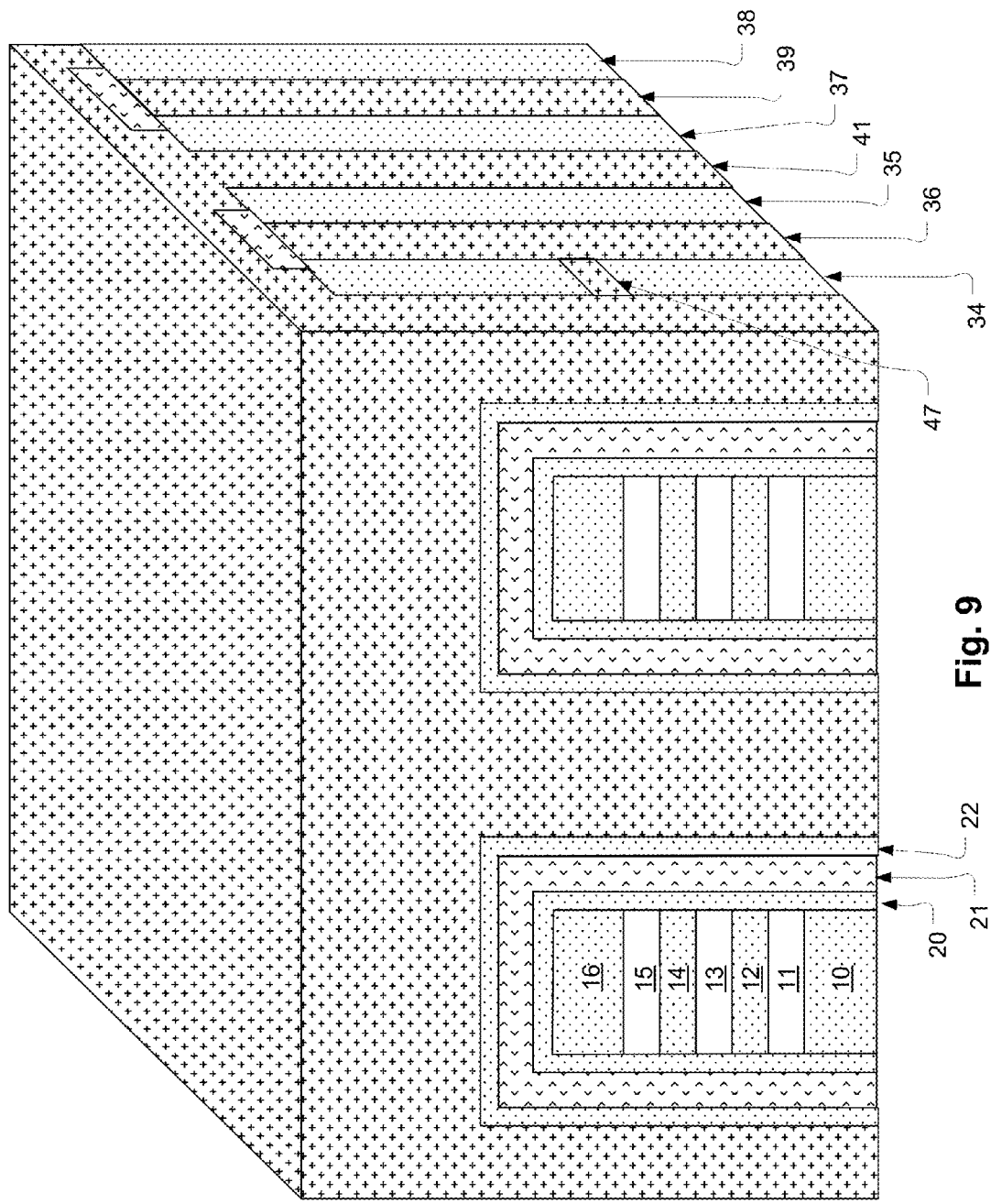
FIG. 9 illustrates part of a process for manufacturing a memory device, and is a perspective illustration of performing a polysilicon fill over the exposed surfaces, and filling in empty trenches from FIG. 8.

FIG. 9 illustrates part of a process for manufacturing a memory device, and is a perspective illustration of performing a polysilicon fill over the exposed surfaces, and filling in empty trenches from FIG. 8.

The trench 33 from FIG. 8 is filled with polysilicon line 41. The polysilicon fill covers previously exposed oxidations masks. The fill can be formed in a variety of ways, including low pressure chemical vapor deposition LPCVD processes. The polysilicon fill also enters the void 47.

Figure 10:
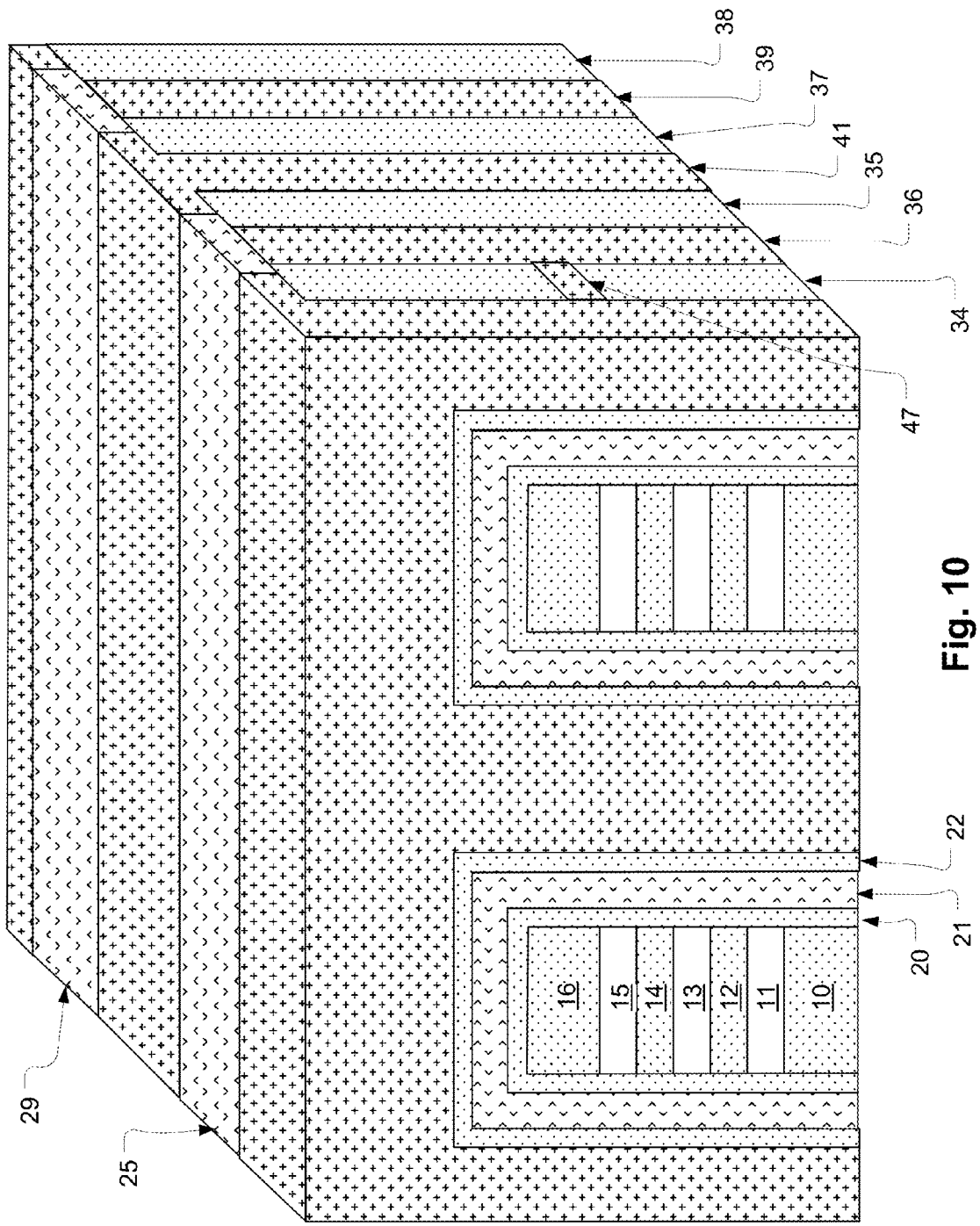
FIG. 10 illustrates part of a process for manufacturing a memory device, and is a perspective illustration of removing polysilicon to expose the oxidations masks from FIG. 9.

FIG. 10 illustrates part of a process for manufacturing a memory device, and is a perspective illustration of performing a polysilicon etch to expose the oxidations masks from FIG. 9.

The removal of excess polysilicon can be performed in a variety of ways, such as dry or wet etching that is selective against etching the underlying oxidation masks, and by chemical mechanical polishing (CMP). Endpoint detection to stop the removal of excess polysilicon can be performed by various processes such as spectrometry laser interferometry, and optical sensing.

Figure 11:
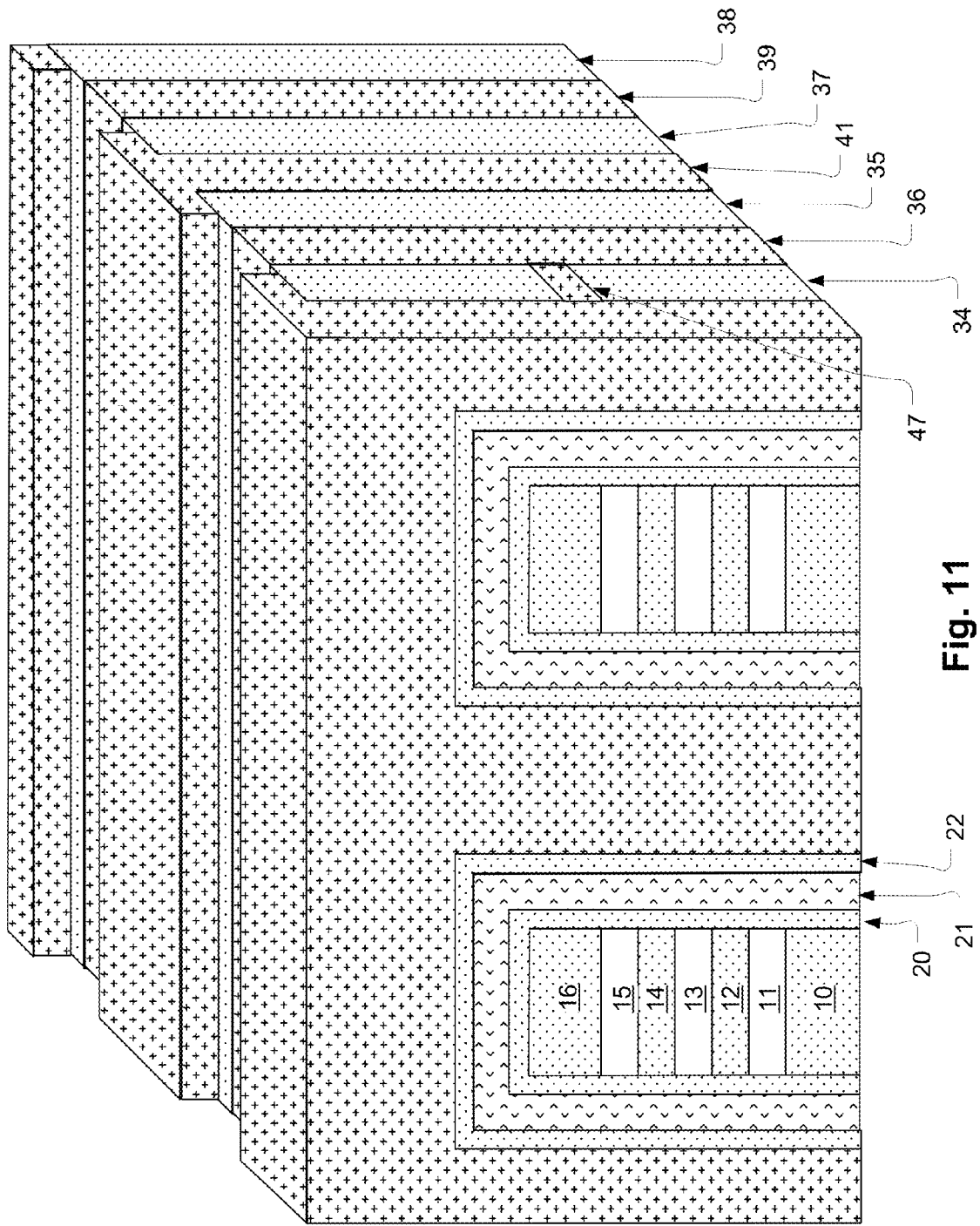
FIG. 11 illustrates part of a process for manufacturing a memory device, and is a perspective illustration of removing the oxidation masks from FIG. 10.

FIG. 11 illustrates part of a process for manufacturing a memory device, and is a perspective illustration of removing the oxidation masks from FIG. 10.

The oxidation masks 25 and 29 are removed to expose the underlying silicon lines 36 and 39 for subsequent removal. The removal of the oxidation masks can be performed in a variety of ways, such as dry or wet etching such as $H_3PO_4$ that is selective against etching the oxide lines 34, 35, 37, and 38, or with various plasmas.

Figure 12:
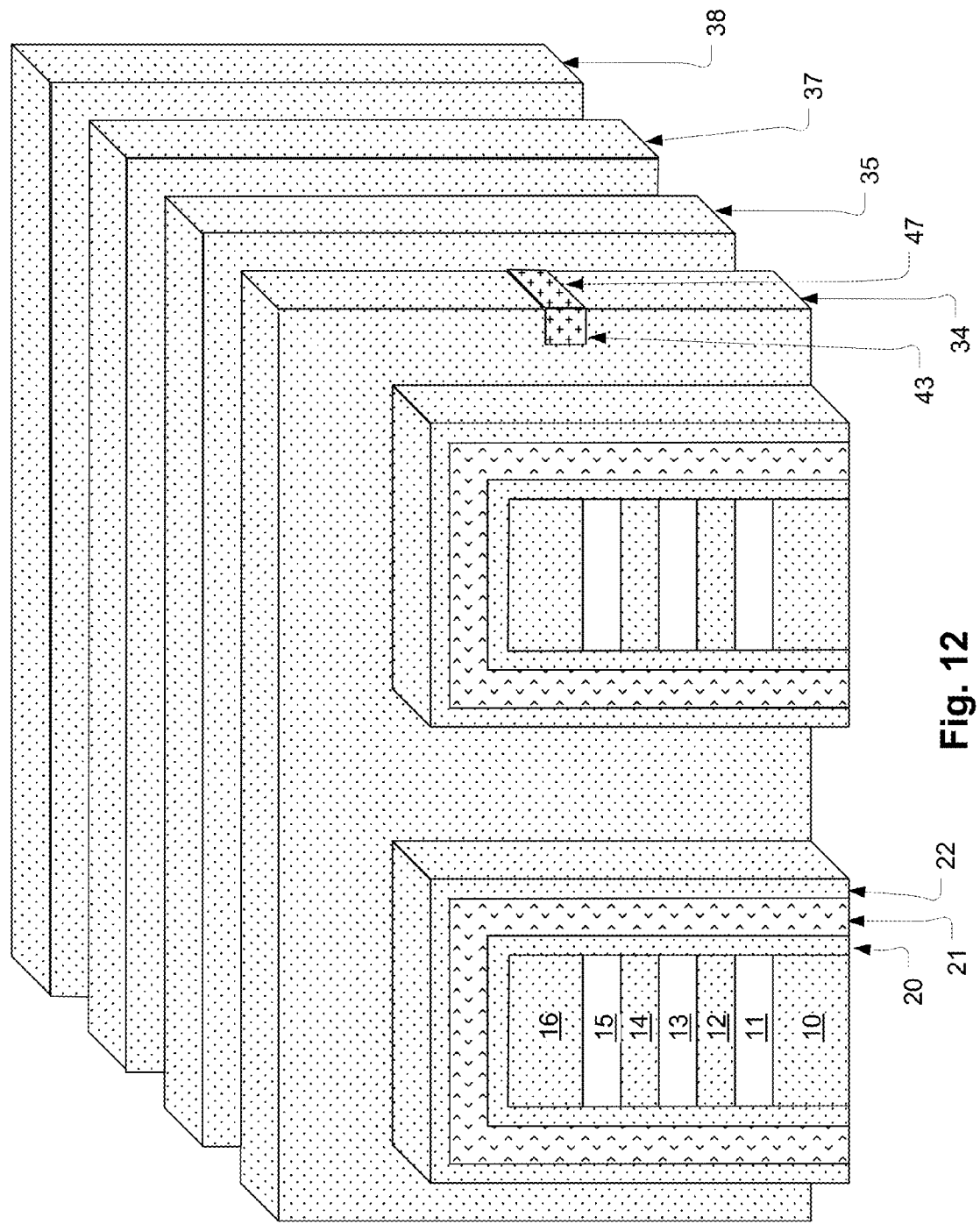
FIG. 12 illustrates part of a process for manufacturing a memory device, and is a perspective illustration of removing the polysilicon lines from FIG. 11.

FIG. 12 illustrates part of a process for manufacturing a memory device, and is a perspective illustration of removing the polysilicon lines from FIG. 11.

Polysilicon can be etched using an etch process that is highly selective for polysilicon over silicon oxides or silicon nitrides. Despite the highly selective etch, during the etch there is oxide loss from exposed oxide such as the outer oxide 22. Such loss varies with position. For example, there is a different amount of oxide loss from the top surfaces of oxide lines 34, 35, 37, and 38; and the side surface of outer oxide 22.

The high aspect ratio word line trenches separate the oxide lines 34, 35, 37, and 38 from prior steps, and indicate where the word lines will be formed in a future step. The polysilicon residue 43 in void 47 in FIG. 12 creates a risk of forming a conductive bridge electrically connecting neighboring word lines. The polysilicon residue 43 in void 47 are addressed in connection with FIG. 13.

In addition to filling in voids as discussed in connection with FIG. 13, removal of the polysilicon allows removal of the outer oxide 22.

Figure 13:
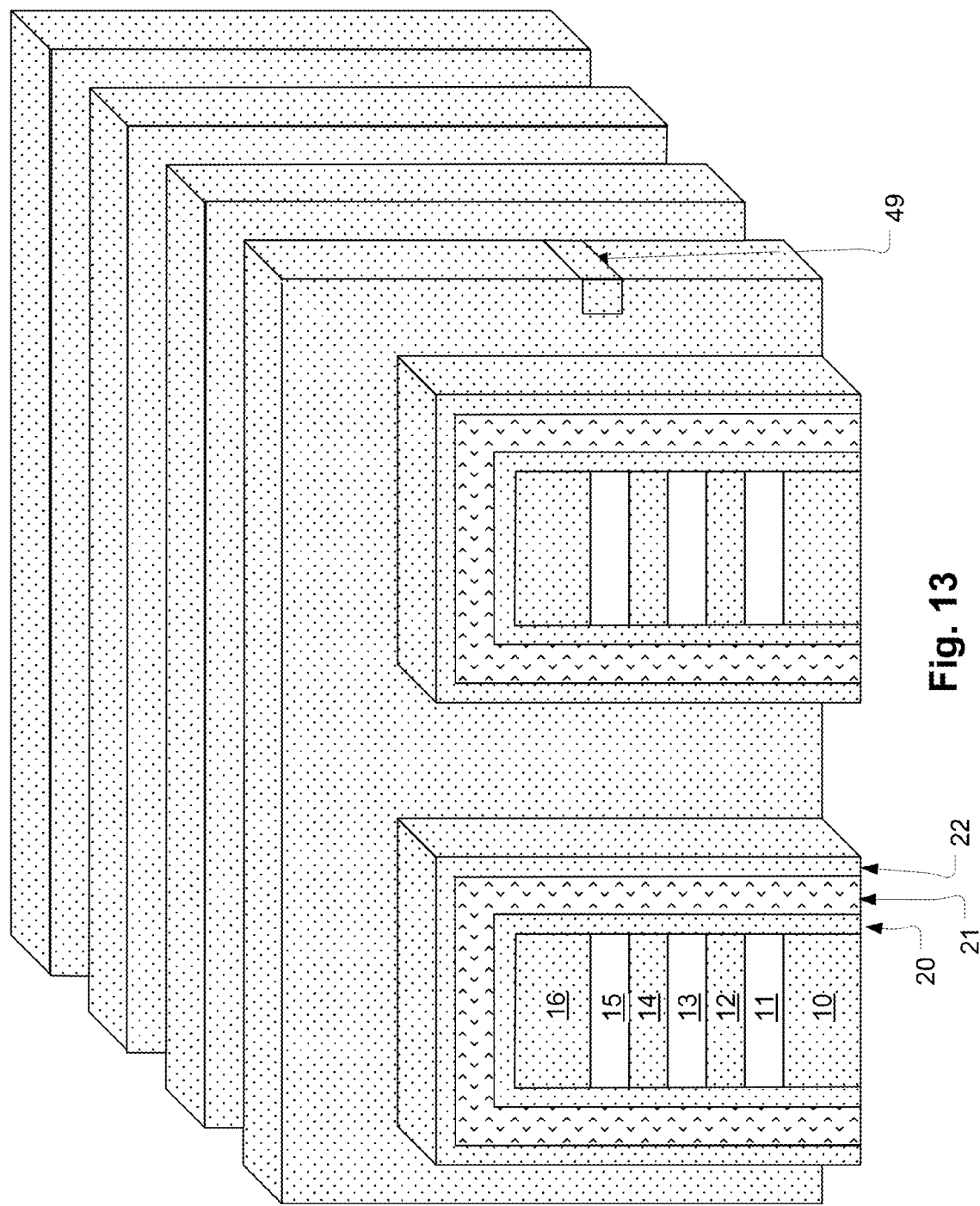
FIG. 13 illustrates part of a process for manufacturing a memory device, and is a perspective illustration of oxidizing polysilicon residue from FIG. 12.

FIG. 13 illustrates part of a process for manufacturing a memory device, and is a perspective illustration of oxidizing polysilicon residue from FIG. 12.

Example oxidation processes are furnace oxidation such as with horizontal furnaces and vertical furnaces, and rapid thermal processors (RTP).

Polysilicon residue 43 is oxidized into oxide 49 During oxidation of the polysilicon which fills in the void, the volume expands. After oxidation, the void 47 will be filled up with oxide, and a portion of the new oxide may overfill the void 47 (not shown).

Figure 14:
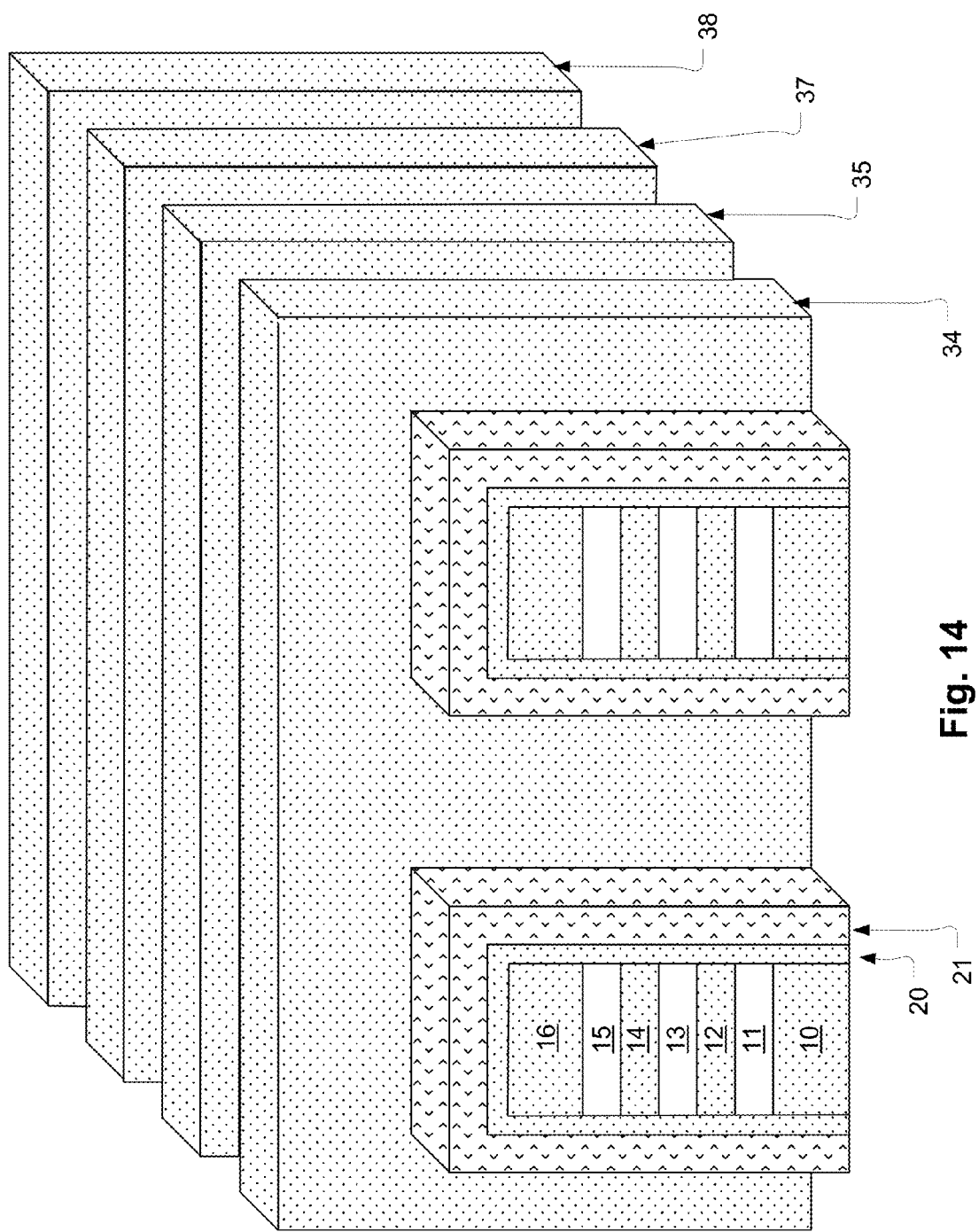
FIG. 14 is illustrates part of a process for manufacturing a memory device, and is a perspective illustration of removing the outer oxide from the oxide-nitride-oxide data storage layers of FIG. 13.

FIG. 14 is illustrates part of a process for manufacturing a memory device, and is a perspective illustration of removing the outer oxide from the oxide-nitride-oxide data storage layers of FIG. 13.

The sacrificial outer oxide may have been damaged during the lithographic patterning of polysilicon line 30 in connection with FIG. 6, as the etching process reached the sacrificial outer oxide.

The sacrificial outer oxide is removed from the data storage layers covering the plurality of ridge-shaped stacks. For example, HF base solution, is a selective etch with a high $SiO_2$ etch rate, and very low SiN etch rate. Due to the selective etch, not much SiN will be lost despite over etch of the $SiO_2$. Example over etch ranges are 20-50%. For example, if the oxide thickness to be removed is 100 angstroms, and HF etch rate is 100 angstroms10 min, then dipping in HF for 12 min is a 20% over etch. The extra etch time is 12 minutes–10 minutes=2 minutes, and (2 minutes10 minutes)=20% over etch. Another selective etch is $NH_4OH$. After removing the outer oxide layer 22, the nitride layer 21 is exposed.

After the oxide removal, an example thickness range of the oxide lines 34, 35, 37, and 38 is 100-350 angstroms, with an example thickness of 300 angstroms.

Figure 15:
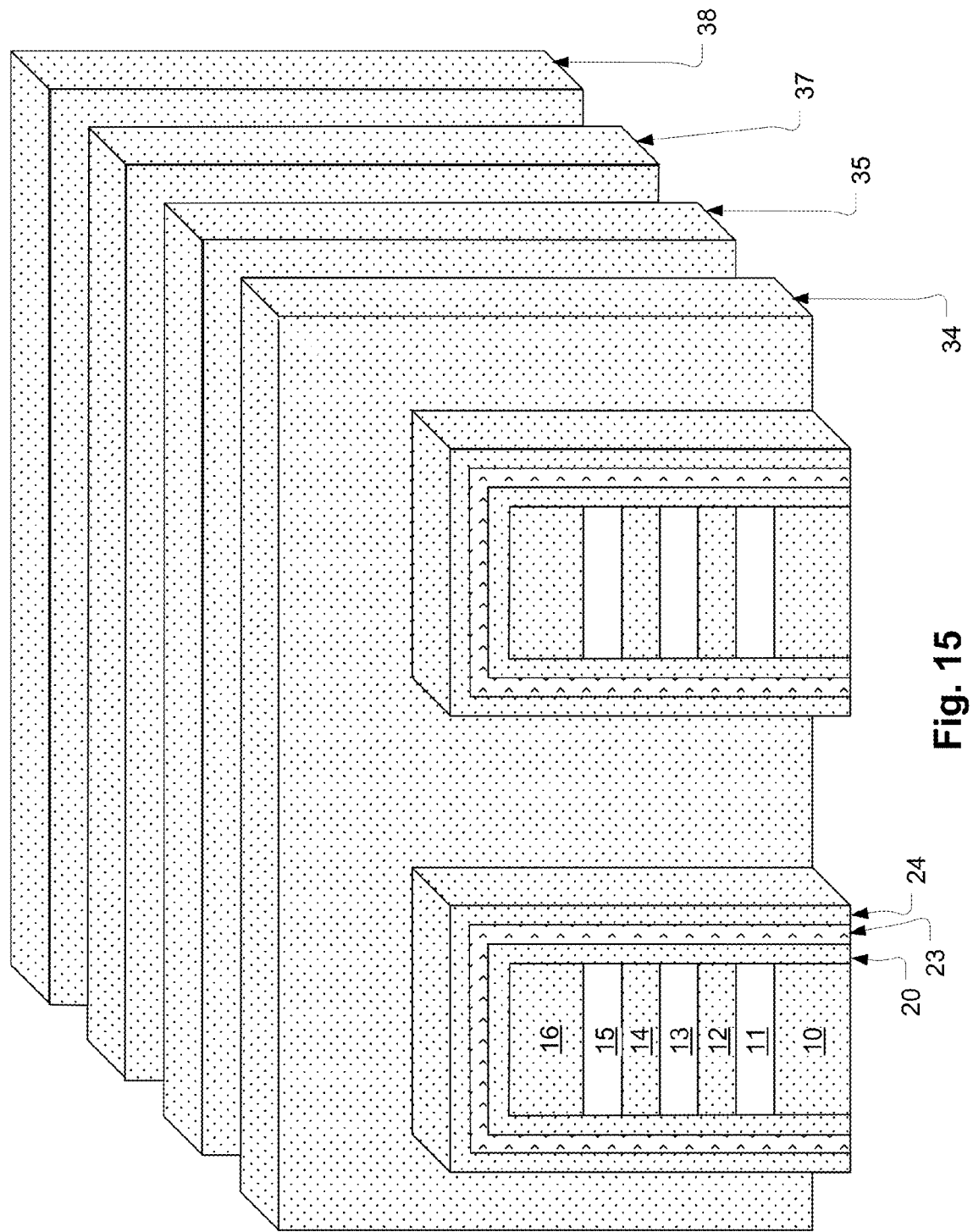
FIG. 15 illustrates part of a process for manufacturing a memory device, and is a perspective illustration of forming the outer oxide on the nitride-oxide data storage layers of FIG. 14.

FIG. 15 illustrates part of a process for manufacturing a memory device, and is a perspective illustration of forming the outer oxide on the nitride-oxide data storage layers of FIG. 14.

In the oxidation, SiN+$O_2$ (high temp) forms $SiO_2$(solid)+ $N_2$ (gas). Example high temperature of 1200 deg C. to oxidize SiN is higher than the example high temperature of 900 deg C. to oxidize Si. A strong oxidant such as $OH^-$ and $O_2$ oxygen atoms help oxidize SiN.

In this self-aligned process, $SiO_2$ is formed from the SiN in the word line trenches between neighboring oxide lines 34, 35, 37, and 38. Part of nitride layer 21 is consumed to leave a thinner nitride layer 23, and the regrown oxide layer 24.

Figure 16:
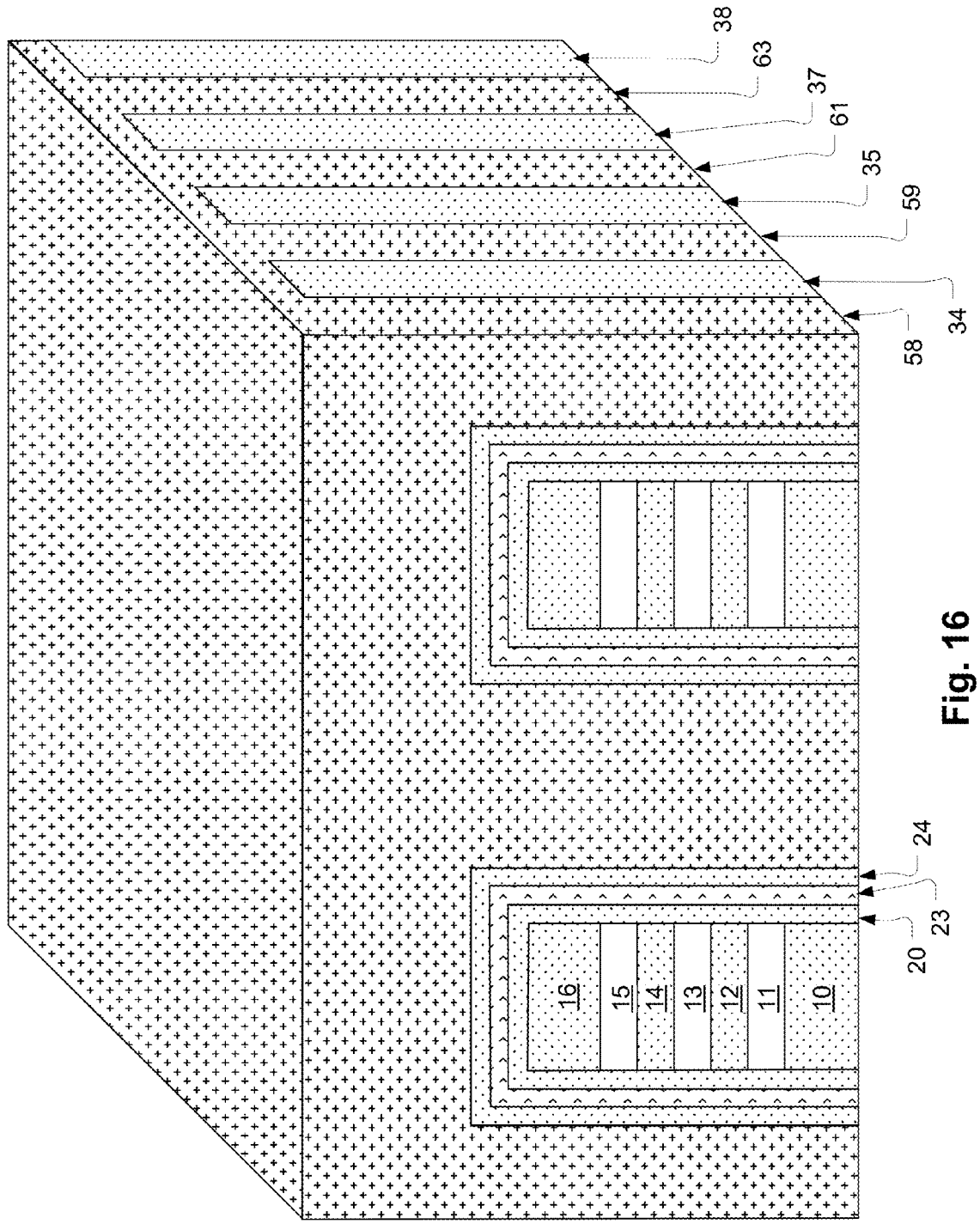
FIG. 16 illustrates part of a process for manufacturing a memory device, and is a perspective illustration of performing a polysilicon fill over the exposed surfaces, and filling in word line trenches from FIG. 15.

FIG. 16 illustrates part of a process for manufacturing a memory device, and is a perspective illustration of performing a polysilicon fill over the exposed surfaces, and filling in word line trenches from FIG. 15 separating the oxide lines 34, 35, 37, and 38.

The polysilicon word lines 58, 59, 61, and 63 are formed conformally over the data storage layers covering the plurality of stacks of semiconductor strips. The polysilicon word lines 58, 59, 61, and 63 fill the trenches defined by the plurality of stacks of semiconductor strips. Additional polysilicon word lines can be formed along the y-axis out of the page and into the page. Neighboring polysilicon word lines are separated by an oxide line. This is a damascene process, as the polysilicon word lines fill previously defined trenches, such as the trenches formed between neighboring oxide lines oxide lines 34, 35, 37, and 38.

Figure 17:
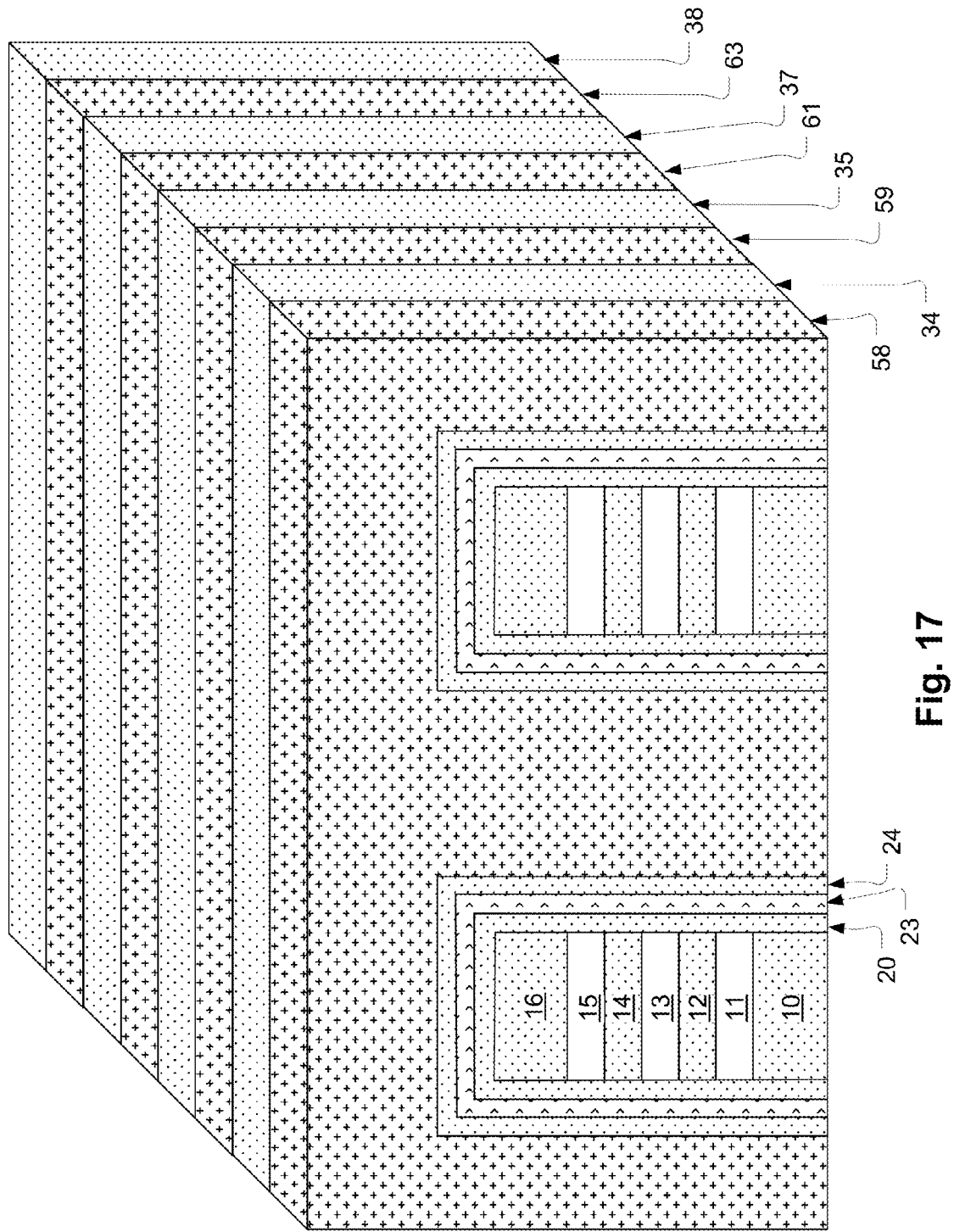
FIG. 17 illustrates part of a process for manufacturing a memory device, and is a perspective illustration of removing excess polysilicon from FIG. 16.

FIG. 17 illustrates part of a process for manufacturing a memory device, and is a perspective illustration of removing excess polysilicon from FIG. 16.

The removal of excess polysilicon can be performed in a variety of ways, such as dry or wet etching that is selective against etching the underlying oxidation masks, and by chemical mechanical polishing (CMP). Endpoint detection to stop the removal of excess polysilicon can be performed by various processes such as spectrometry laser interferometry, and optical sensing.

Figure 1:
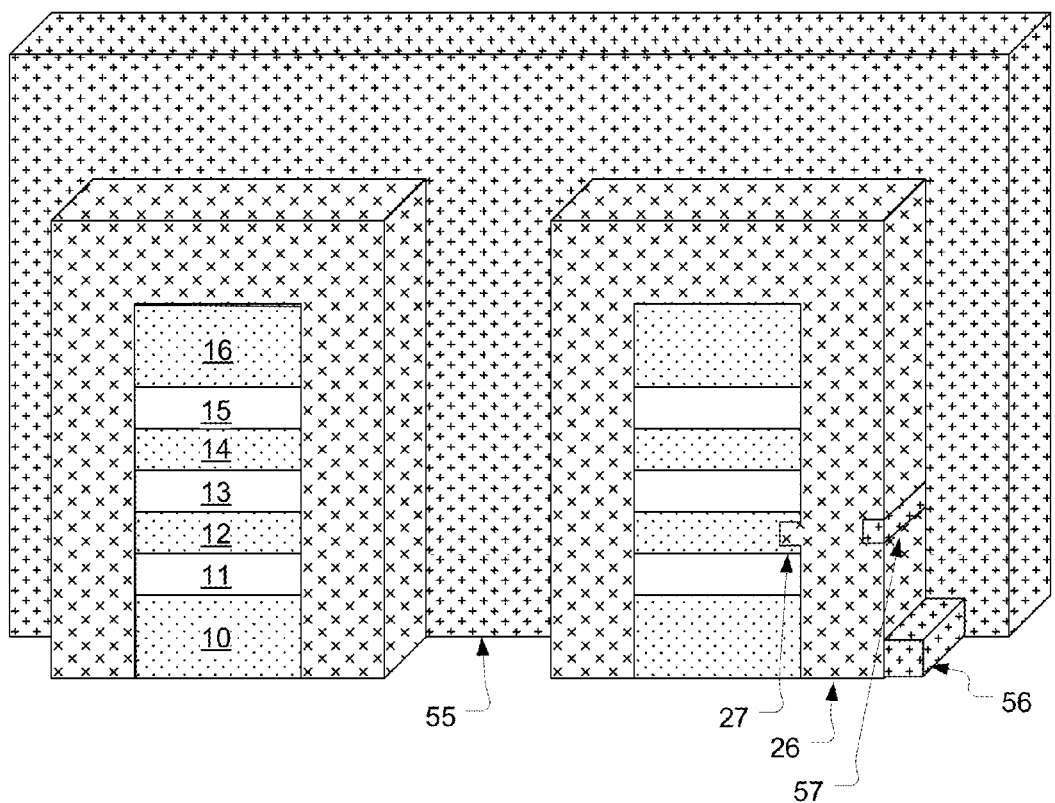
FIG. 1 is a perspective illustration of a three dimensional memory array device, where the polysilicon word lines are formed prior to the oxide lines separating the word lines, and polysilicon residue forms an undesirable bridge electrically connecting neighboring word lines.
Figure 2:
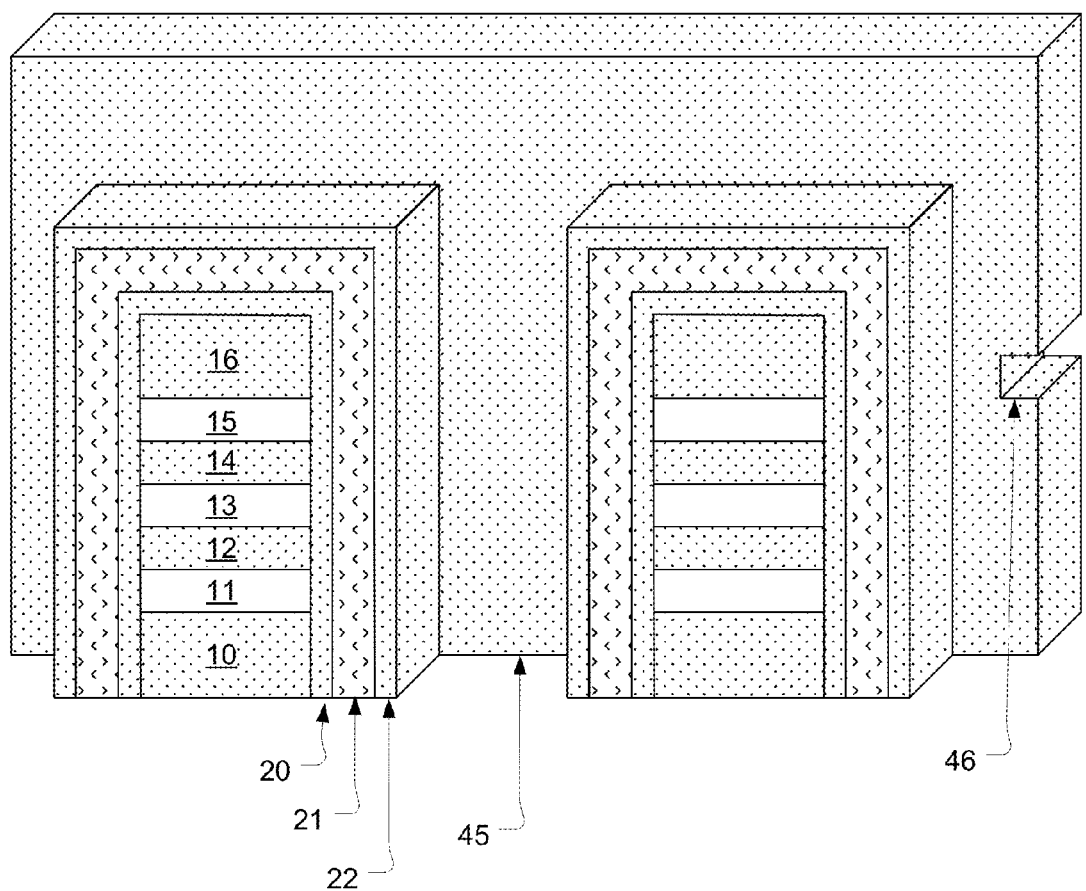
FIG. 2 is a perspective illustration of a three dimensional memory array device, where the oxide lines are formed prior to the polysilicon word lines, and an oxide void allows polysilicon residue to form an undesirable bridge electrically connecting neighboring word lines.
Figure 3:
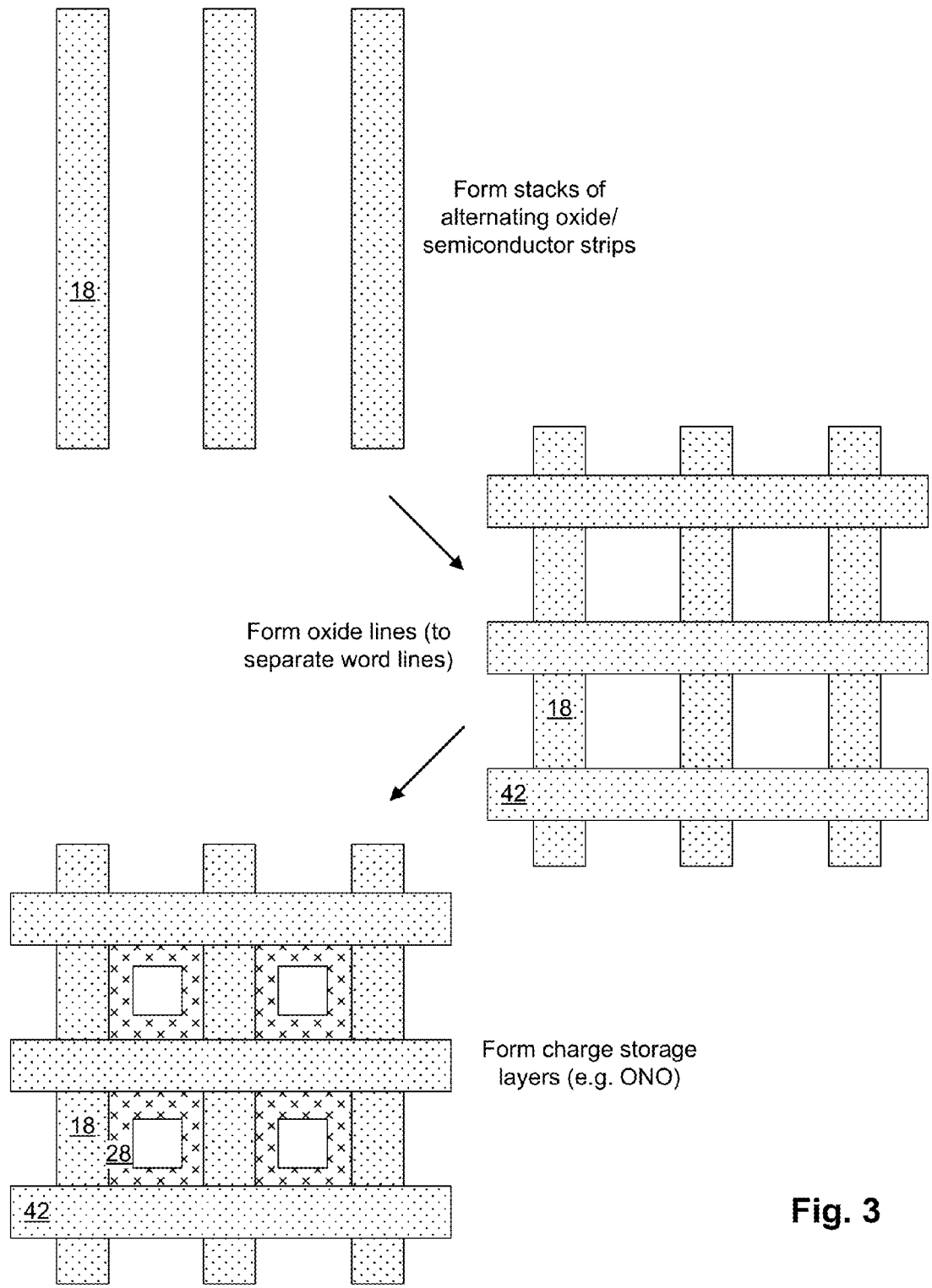
FIG. 3 is a top view of a three dimensional memory array device, where the ONO storage layers are formed after the oxide lines but prior to the polysilicon word lines, resulting in larger dimensions of the array.

The polysilicon word lines 58, 59, 61, and 63 define a multi-layer array of interface regions at cross-points between side surfaces of the semiconductor strips 11, 13, 15 on the stacks and the polysilicon word lines 58, 59, 61, and 63. The damascene process is an alternative to subtractive interconnect structures, such as in FIG. 1 where the deposited polysilicon word lines are patterned by etching.

The polysilicon word lines 58, 59, 61, and 63 can be a semiconductor material with the same or a different conductivity type as the semiconductor strips 11, 13, 15 (e.g. heavily doped p+-type polysilicon).

Memory cells comprising field effect transistors having charge storage structures are formed in the 3D array of cross-points. Using dimensions for the widths of the semiconductor strips and word lines on the order of 25 nanometers, with gaps between the ridge-shaped stacks on the order of 25 nanometers, a device having a few tens of layers (e.g. 32 layers) can approach terabit capacity ($10^{12}$) in a single chip.

In one embodiment charge trapping dielectric memory cells are formed at the intersection of polysilicon word lines 58, 59, 61, and 63 and semiconductor strips 11, 13, 15. Active charge trapping dielectric regions are formed on the both sides of the strip semiconductor strips 11, 13, 15, between the polysilicon word lines 58, 59, 61, and 63 and the semiconductor strips 11, 13, 15. In the embodiment described here, each memory cell is a double gate field effect transistor having active charge storage regions, one on each side of the semiconductor strip. Electron current flows along the semiconductor strips, to sense amplifiers where it can be measured to indicate the state of a selected memory cell.

The sourcedrain regions on either side of the polysilicon word lines 58, 59, 61, and 63 along the semiconductor strips can be "junction-free", without source and drain doping having a conductivity type opposite that of the channel regions along the semiconductor strips beneath the word lines. In the junction free embodiment, the charge trapping dielectric field effect transistors can have a p-type channel structure. Also, source and drain doping could be implemented in some embodiments, in a self-aligned implant after word line definition.

In alternative embodiments, the semiconductor strips 11, 13, 15 can be implemented using a lightly doped n-type semiconductor body in junction free arrangements, resulting in a buried-channel field effect transistor which can operate in depletion mode, with naturally shifted lower threshold distributions for the charge trapping dielectric cells.

Figure 18:
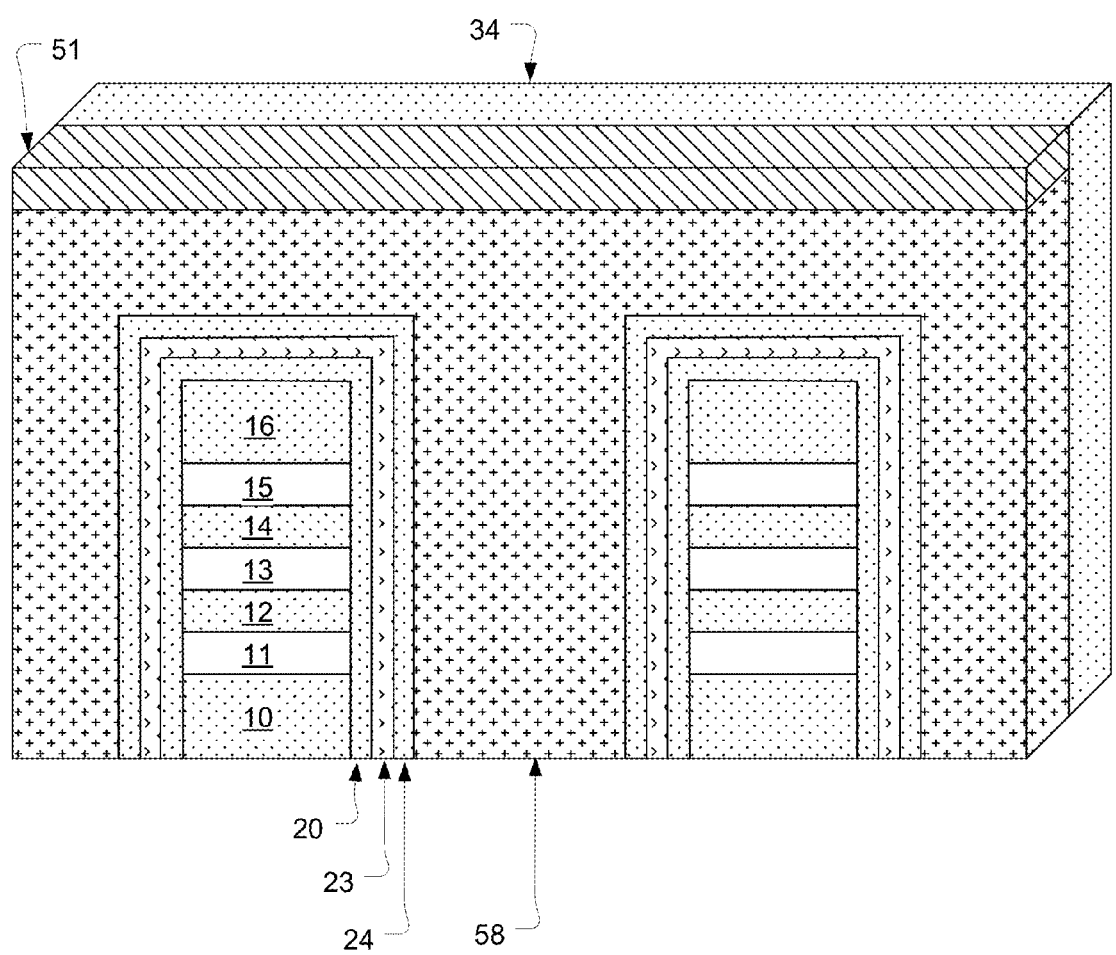
FIG. 18 illustrates part of a process for manufacturing a memory device, and is a perspective illustration of forming silicided polysilicon word lines from the polysilicon word lines of FIG. 17.

FIG. 18 illustrates part of a process for manufacturing a memory device, and is a perspective illustration of forming silicided polysilicon word lines from the polysilicon word lines of FIG. 17.

A layer of silicide (e.g. tungsten silicide, cobalt silicide, titanium silicide) 51 can be formed over the top surface of the word line 58. Deposition is followed by RTP (Rapid Thermal Processing).

Figure 19:
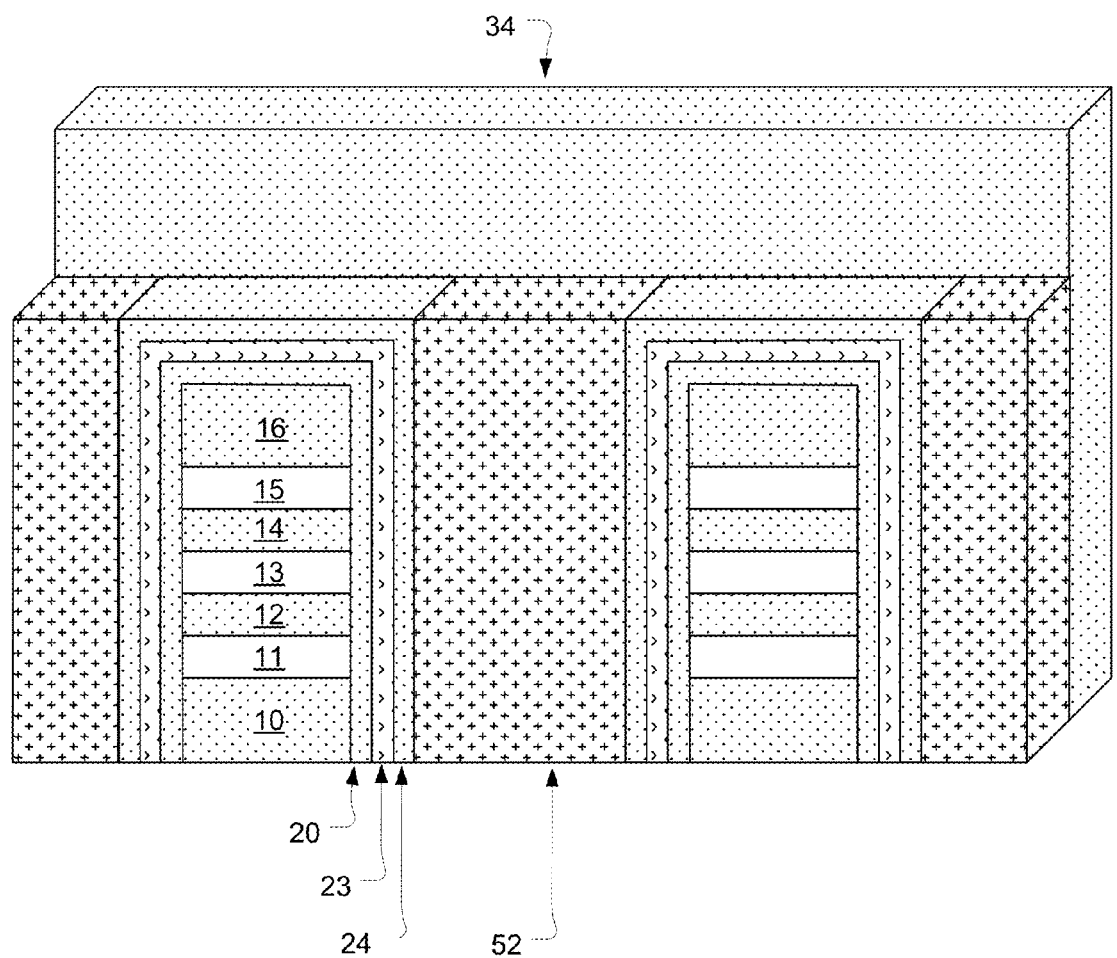
FIG. 19 is an alternative of FIG. 18, illustrating part of a process for manufacturing a memory device, and is a perspective illustration of removing polysilicon above the oxide-nitride-oxide data storage layers on the plurality of ridge-shaped stacks of FIG. 17.

FIG. 19 is an alternative of FIG. 18, illustrating part of a process for manufacturing a memory device, and is a perspective illustration of removing polysilicon above the oxide-nitride-oxide data storage layers on the plurality of ridge-shaped stacks of FIG. 17. After removal, vertical polysilicon members 52 remain on the sides of the plurality of ridges.

Figure 20:
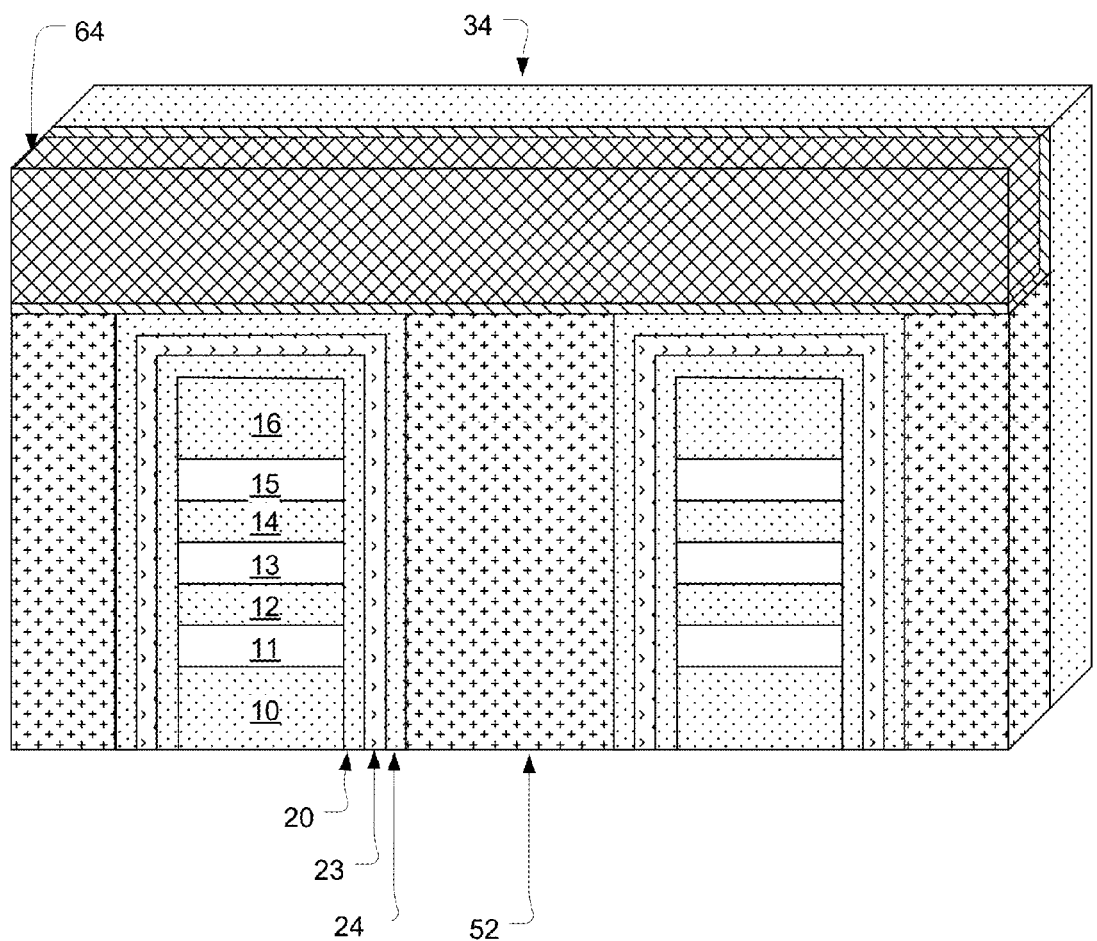
FIG. 20 is an alternative of FIG. 18, illustrating part of a process for manufacturing a memory device, and is a perspective illustration of forming word lines with metal surfaces on the exposed outer oxide of the oxide-nitride-oxide data storage layers and on the exposed polysilicon of FIG. 19.

FIG. 20 is an alternative of FIG. 18, illustrating part of a process for manufacturing a memory device, and is a perspective illustration of forming word lines with metal surfaces on the exposed outer oxide of the oxide-nitride-oxide data storage layers and on the exposed polysilicon of FIG. 19.

TiN is deposited conformally, followed by W deposition and removal of excess material, such as by etching or CMP.

Figure 21:
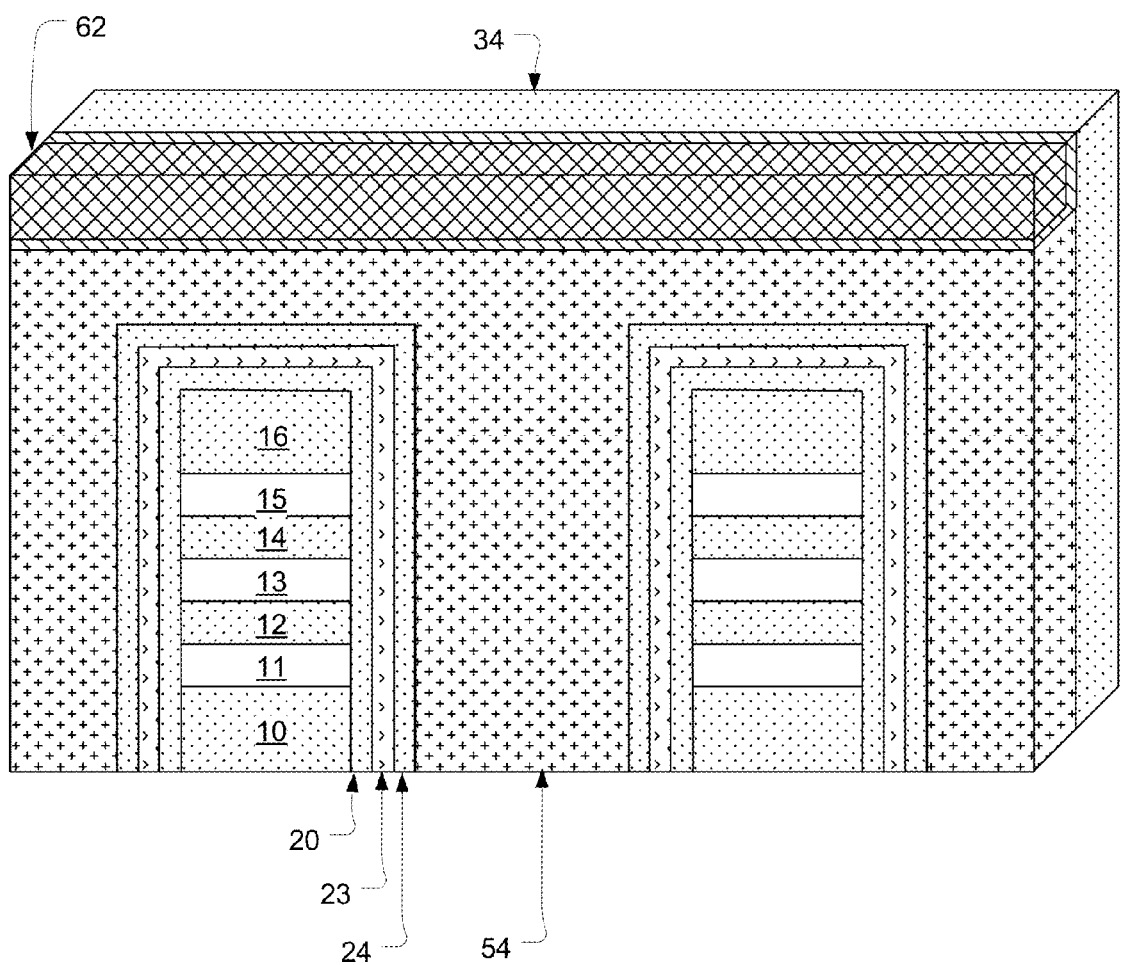
FIG. 21 is an alternative of FIG. 18, illustrating part of a process for manufacturing a memory device, and is a perspective illustration of forming word lines with metal surfaces on exposed polysilicon.

FIG. 21 is an alternative of FIG. 18, illustrating part of a process for manufacturing a memory device, and is a perspective illustration of forming word lines with metal surfaces on exposed polysilicon.

Unlike FIG. 18, following the polysilicon etch, a horizontal polysilicon member is left that connects the vertical polysilicon members on the sides of the plurality of ridges.

The metal is deposited on the exposed horizontal polysilicon member. More particularly, TiN is deposited conformally, followed by W deposition and removal of excess material, such as by etching or CMP.

Figure 22:
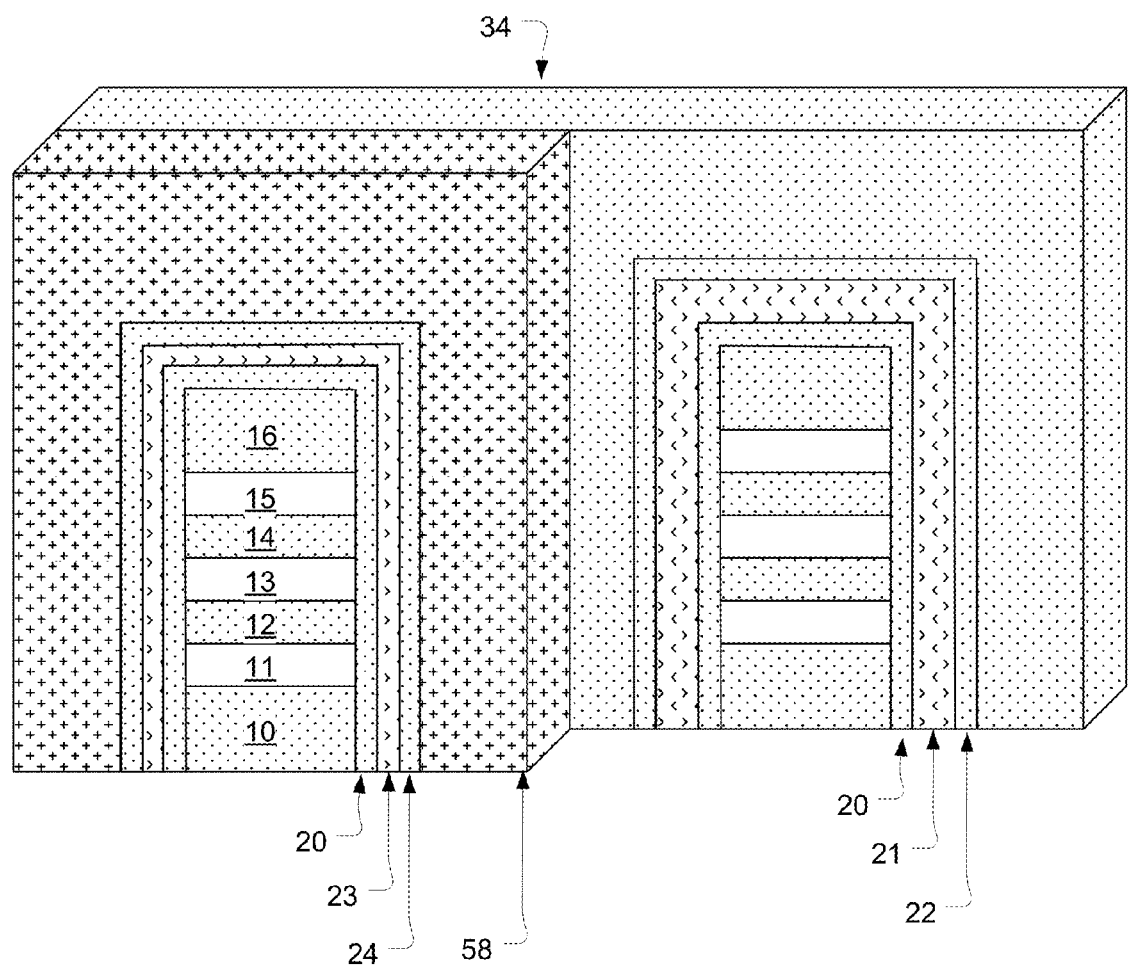
FIG. 22 is a perspective view comparing the nitride layer of the oxide-nitride-oxide data storage layers, between the areas under the word lines and the areas under the oxide lines.

FIG. 22 is a perspective view comparing the nitride layer of the oxide-nitride-oxide data storage layers, between the areas under the word lines and the areas under the oxide lines.

The nitride layer 23 for the kernel area, or the region under a word line 58, is thinner than the nitride layer 21 for the region under an oxide line 34. The thinner nitride layer 23 results from oxidation of part of the nitride layer 21 as discussed in connection with FIG. 12. The thicker nitride layer 21 under the oxide line 34 helps reduce unwanted operations due to fringing electric fields.

Figure 23:
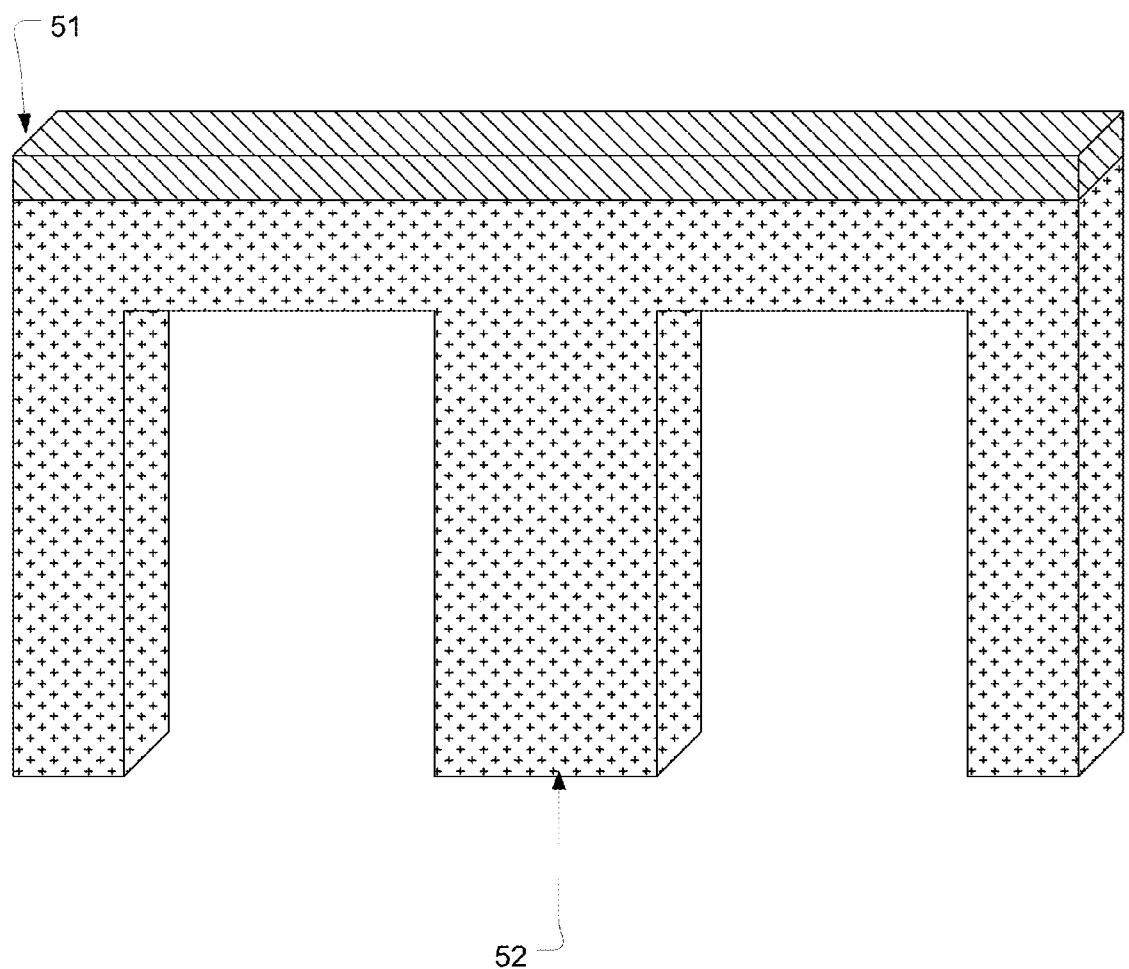
FIGS. 23-25 are perspective views of various "M"-shaped gates.
Figure 24:
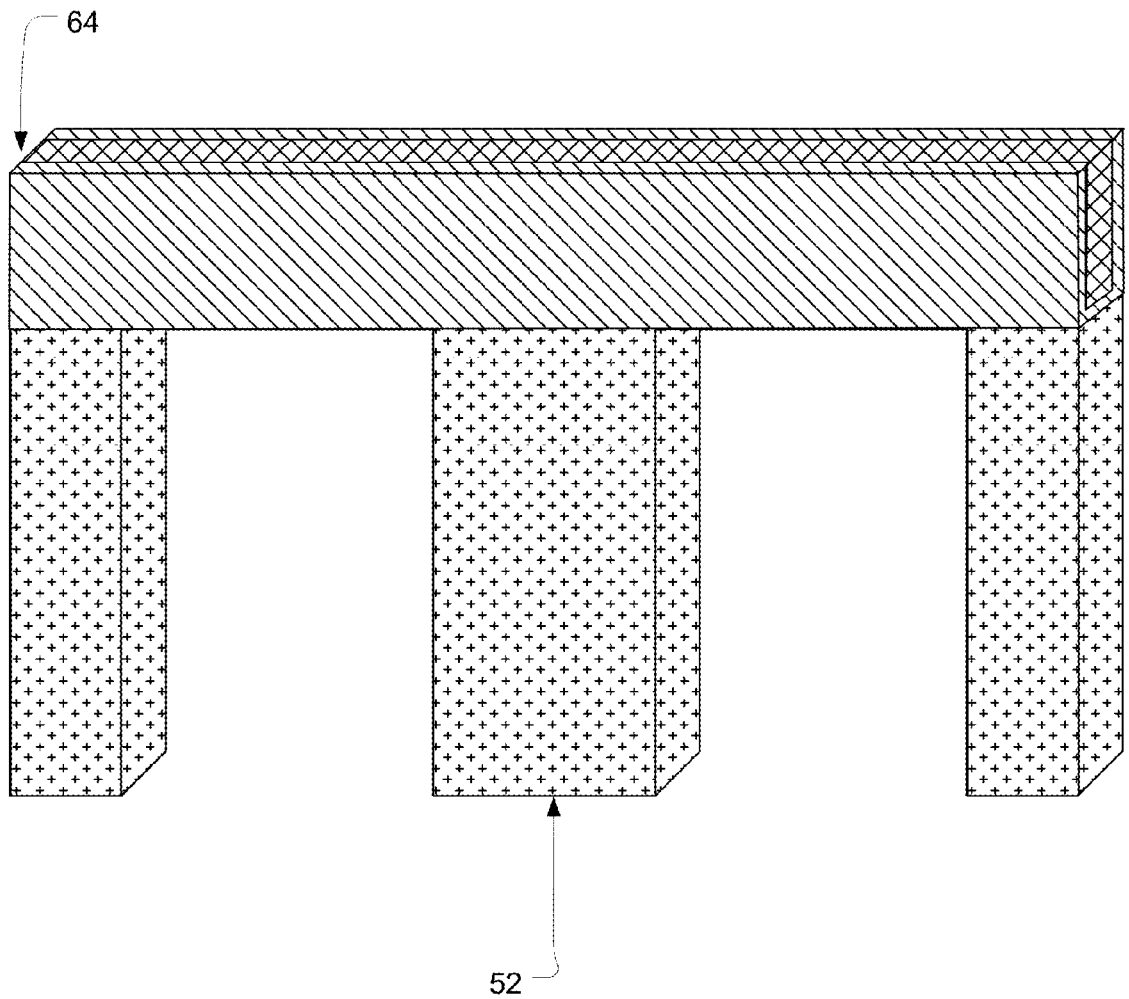
Figure 25:
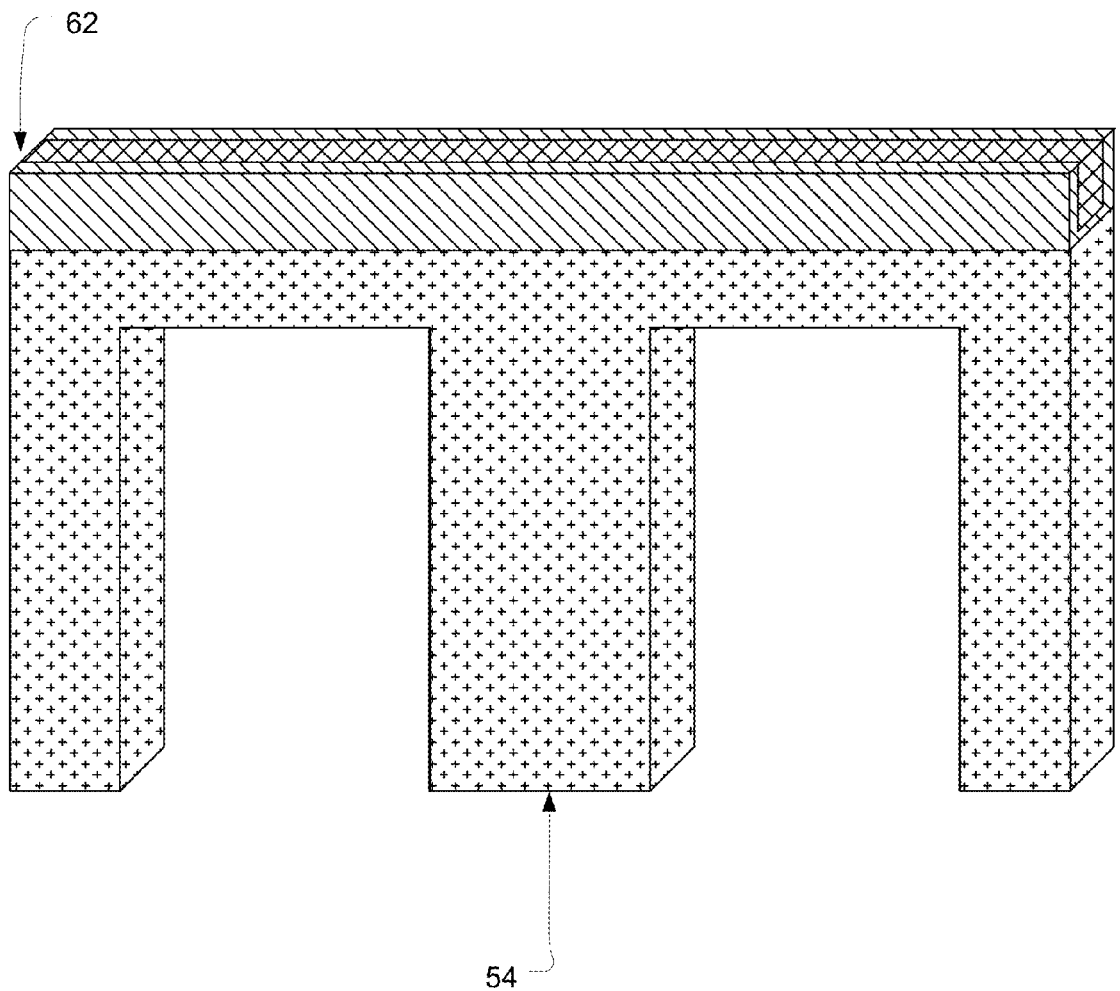

FIGS. 23-25 are perspective views of various "M"-shaped gates. FIG. 23 shows the "M"-shaped gate from FIG. 18. FIG. 24 shows the "M"-shaped gate from FIG. 20. FIG. 25 shows the "M"-shaped gate from FIG. 21. In FIGS. 24 and 25, the proximal surfaces of the respective metal lines 64 and 62 are covered with the conformal liner such as TiN. In contrast, in FIGS. 20 and 21 the proximal surfaces of the respective metal lines 64 and 62 were shown uncovered by the conformal liner such as TiN for illustration purposes.

Figure 26:
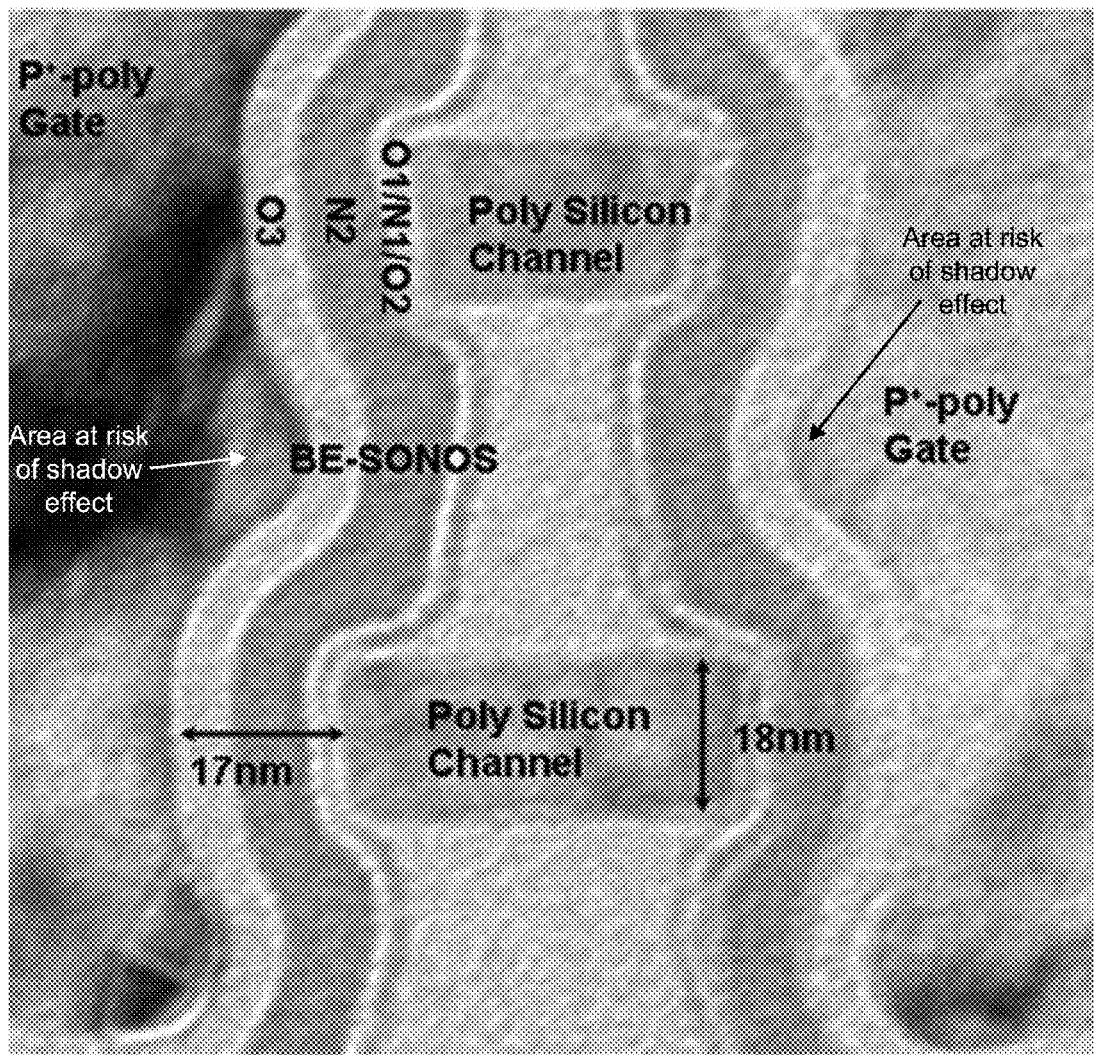
FIG. 26 is a picture of a cross-section of part of a 3D memory with a stack of alternating channels and oxides, illustrating areas of potential "shadow effect".

FIG. 26 is a picture of a cross-section of part of a 3D memory with a stack of alternating channels and oxides, illustrating areas of potential "shadow effect".

The TEM cross-section shows a portion of an 8-layer vertical gate, thin-film-transistor, BE-SONOS charge trapping dielectric NAND device which has been fabricated and tested. The device was made with a 75 nm half pitch. The channels were n-type polysilicon about 18 nm thick. No additional junction implant was used, resulting in a junction free structure. The insulating material between the strips to isolate the channels in the Z-direction was silicon dioxide was about 40 nm thick. The gates were provided by a p+-polysilicon line. The test device implemented 32 word line, junction-free NAND strings. The width of the lower strip is greater than the width of the upper strip because the trench etch used to form the structure resulted in a tapered side wall with progressively wider strips as the trench becomes deeper, and with the insulating material between the strips being etched more than the polysilicon. The narrower width of the insulating material, and the broader width of the adjacent channels, results in a surrounding gate effect that benefits device control and performance. However, another result is the potential shadow effect areas which induce unwanted polysilicon residues in the shadow effect areas. Fortunately, in various disclosed embodiments, such polysilicon residues are oxidized so that the polysilicon residues do not remain and create undesirable electrical connection between neighboring word lines.

After an interlayer dielectric is formed over the top of the array, vias are opened in which contact plugs, using tungsten fill for example, are formed reaching to the top surfaces of the gate structures. Overlying metal lines are patterned to connect as SSL lines, to column decoder circuits. A three-plane decoding network is established, accessing a selected cell using one word line, one bit line and one SSL line. See, U.S. Pat. No. 6,906,940, entitled Plane Decoding Method and Device for Three Dimensional Memories.

As a result, a 3D array of SONOS-type memory cells configured in a NAND flash array can be formed. The source, drain and channel are formed in the silicon (S) semiconductor strips, the layer of the memory material includes a tunneling dielectric layer which can be formed of silicon oxide (O), a charge storage layer which can be formed of silicon nitride (N), a blocking dielectric layer which can be formed of silicon oxide (O), and the gate comprises polysilicon (S) of the word lines.

In other embodiments, the NAND memory cells are replaced by other types of memory cells. For example, manowire MOSFET type cells can also be configured in this manner, by providing nanowire or nanotube structures in channel regions on word lines 111-114, like those described in Paul, et al., "Impact of a Process Variation on Nanowire and Nanotube Device Performance", IEEE Transactions on Electron Devices, Vol. 54, No. 9, September 2007, which article is incorporated by reference as if fully set forth herein.

Figure 27:
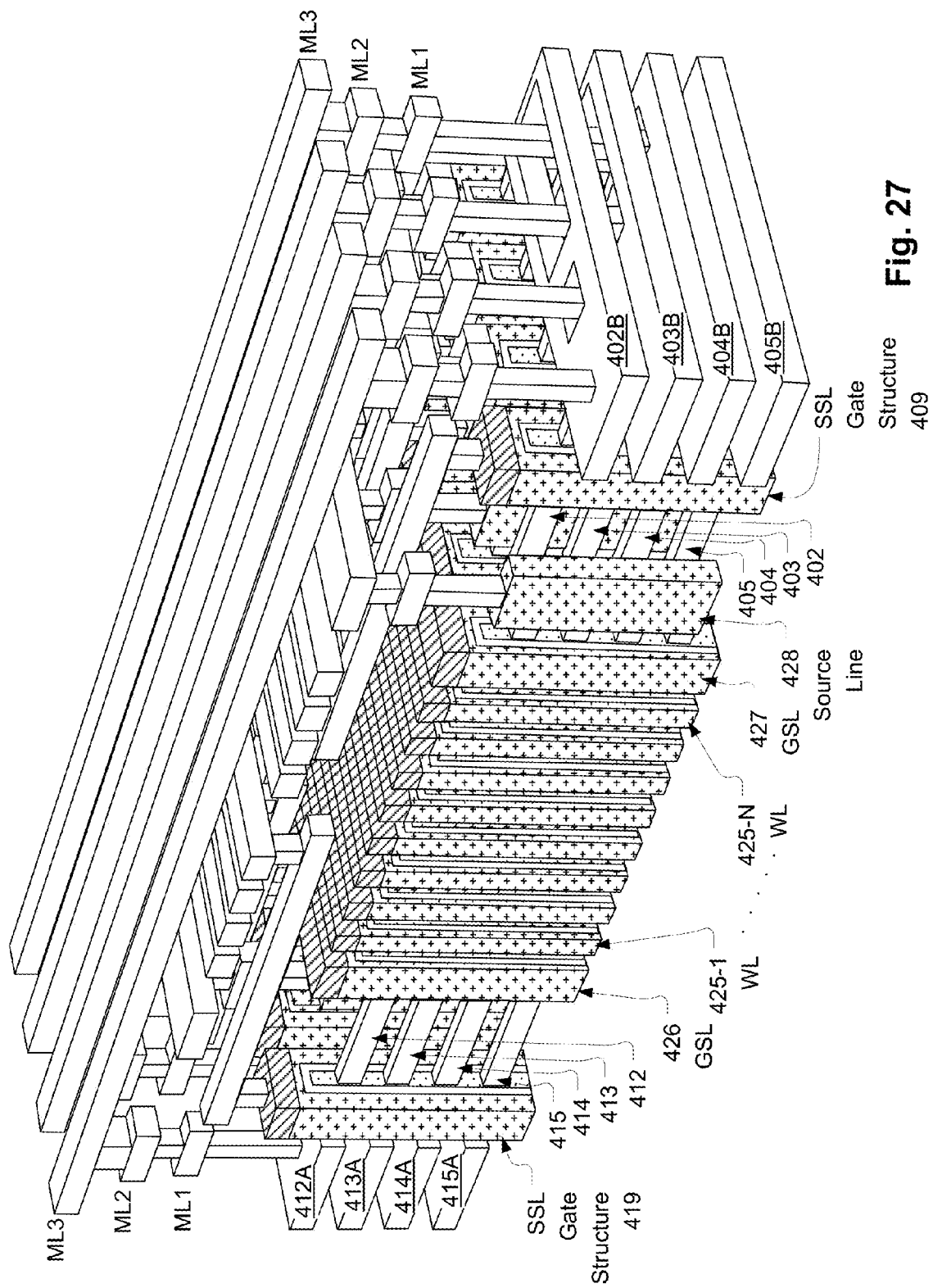
FIG. 27 is an example 3D memory structure with the damascene gate.

FIG. 27 is an example 3D memory structure with the damascene gate. A 3D NAND-flash memory array structure has metal layers of string select lines (a lengthwise orientation layer parallel to the semiconductor material strips, a widthwise orientation layer parallel to the word lines) and bit lines with a lengthwise orientation parallel to the semiconductor material strips. Insulating material is removed from the drawing to expose additional structure. For example, insulating layers are removed between the semiconductor strips, in the ridge-shaped stacks, and are removed between the ridge-shaped stacks of semiconductor strips.

The multilayer array is formed on an insulating layer, and includes a plurality of word lines 425-1, . . . , 425-n−1, 425-n conformal with the plurality of ridge-shaped stacks, and which act as word lines WLn, WLn−1, . . . WL1. The damascene word lines are discussed herein. An example word line pitch is 75 nm, divided into a 40 nm word line thickness and a 35 nm space between adjacent word lines, which is a ratio of the word line thickness to the space between adjacent word lines of about 1.14. An example word line pitch range extends from 75 nm down to about 30 nm. The ratio of the word line thickness to the space between adjacent word lines has a range of about 0.8-1.2. The plurality of ridge-shaped stacks includes semiconductor strips 412, 413, 414, 415. Semiconductor strips in the same plane are electrically coupled together by stairstep structures.

The shown word line numbering, ascending from 1 to N going from the back to the front of the overall structure, applies to even memory pages. For odd memory pages, the word line numbering descends from N to 1 going from the back to the front of the overall structure.

Stairstep structures 412A, 413A, 414A, 415A terminate semiconductor strips, such as semiconductor strips 412, 413, 414, 415. As illustrated, these stairstep structures 412A, 413A, 414A, 415A are electrically connected to different bit lines for connection to decoding circuitry to select planes within the array. These stairstep structures 412A, 413A, 414A, 415A can be patterned at the same time that the plurality of ridge-shaped stacks are defined.

Stairstep structures 402B, 403B, 404B, 405B terminate semiconductor strips, such as semiconductor strips 402, 403, 404, 405. As illustrated, these stairstep structures 402B, 403B, 404B, 405B are electrically connected to different bit lines for connection to decoding circuitry to select planes within the array. These stairstep structures 402B, 403B, 404B, 405B can be patterned at the same time that the plurality of ridge-shaped stacks are defined.

Any given stack of semiconductor strips is coupled to either the stairstep structures 412A, 413A, 414A, 415A, or the stairstep structures 402B, 403B, 404B, 405B, but not both. A stack of semiconductor strips has one of the two opposite orientations of bit line end-to-source line end orientation, or source line end-to-bit line end orientation. For example, the stack of semiconductor strips 412, 413, 414, 415 has bit line end-to-source line end orientation; and the stack of semiconductor strips 402, 403, 404, 405 has source line end-to-bit line end orientation.

The stack of semiconductor strips 412, 413, 414, 415 is terminated at one end by the stairstep structures 412A, 413A, 414A, 415A, passes through SSL gate structure 419, gate select line GSL 426, word lines 425-1 WL through 425-N WL, gate select line GSL 427, and terminated at the other end by source line 428. The stack of semiconductor strips 412, 413, 414, 415 does not reach the stairstep structures 402B, 403B, 404B, 405B.

The stack of semiconductor strips 402, 403, 404, 405 is terminated at one end by the stairstep structures 402B, 403B, 404B, 405B, passes through SSL gate structure 409, gate select line GSL 427, word lines 425-N WL through 425-1 WL, gate select line GSL 426, and terminated at the other end by a source line (obscured by other parts of figure). The stack of semiconductor strips 402, 403, 404, 405 does not reach the stairstep structures 412A, 413A, 414A, 415A.

A layer of memory material separates the word lines 425-1 through 425-n, from the semiconductor strips 412-415 and 402-405 as described in detail in prior figures. Ground select lines GSL 426 and GSL 427 are conformal with the plurality of ridge-shaped stacks, similar to the word lines.

Every stack of semiconductor strips is terminated at one end by stairstep structures, and at the other end by a source line. For example, the stack of semiconductor strips 412, 413, 414, 415 is terminated at one end by stairstep structures 412A, 413A, 414A, 415A, and terminated on the other end by source line 428. At the near end of the figure, every other stack of semiconductor strips is terminated by the stairstep structures 402B, 403B, 404B, 405B; and every other stack of semiconductor strips is terminated by a separate source line. At the far end of the figure, every other stack of semiconductor strips is terminated by the stairstep structures 412A, 413A, 414A, 415A, and every other stack of semiconductor strips is terminated by a separate source line.

Bit lines and string select lines are formed at the metals layers ML1, ML2, and ML3.

Transistors are formed between the stairstep structures 412A, 413A, 414A and the word line 425-1. In the transistors, the semiconductor strip (e.g. 413) acts as the channel region of the device. SSL gate structures (e.g. 419, 409) are patterned during the same step that the word lines 425-1 through 425-n are defined. A layer of silicide can be formed along the top surface of the word lines 425-1 through 425-n, the ground select lines 426 and 427, and over the gate structures 409 and 419. The layer of memory material 415 can act as the gate dielectric for the transistors. These transistors act as string select gates coupled to decoding circuitry for selecting particular ridge-shaped stacks in the array.

The first metal layer ML1 includes string select lines with a lengthwise orientation parallel to the semiconductor material strips. These ML1 string select lines are connected by short vias to different SSL gate structures.

The second metal layer ML2 includes string select lines with a widthwise orientation parallel to the word lines. These ML2 string select lines are connected by short vias to different ML1 string select lines.

In combination, these ML1 string select lines and ML2 string select lines allow a string select line signal to select a particular stack of semiconductor strips.

The first metal layer ML1 also includes two source lines with a widthwise orientation parallel to the word lines.

Finally, the third metal layer ML3 includes bit lines with a lengthwise orientation parallel to the semiconductor material strips. Different bit lines are electrically connected to different steps of the stairstep structures 412A, 413A, 414A, 415A and 402B, 403B, 404B, 405B. These ML3 bit lines allow a bit line signal to select a particular horizontal plane of semiconductor strips.

Because a particular word line allows a word line to select a particular row plane of memory cells, the threefold combination of word line signals, bit line signals, and string select line signals is sufficient to select a particular memory cell from the 3D array of memory cells.

Figure 28:
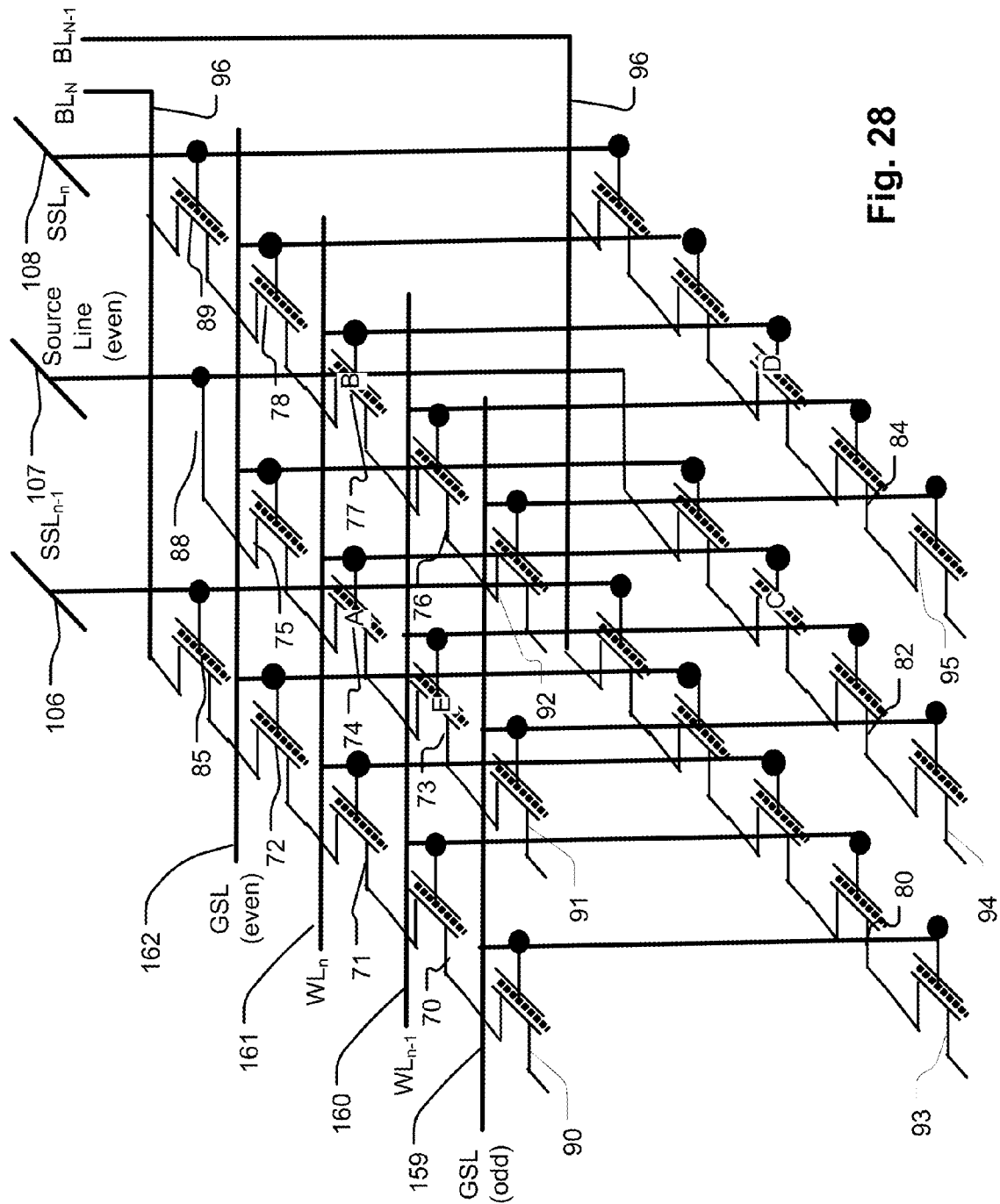
FIG. 28 is a circuit diagram corresponding to the example 3D memory structure of FIG. 23 with the damascene gate.

FIG. 28 is a circuit diagram corresponding to the example 3D memory structure of FIG. 27 with the damascene gate.

The schematic diagram shows 2 planes of memory cells having 9 charge trapping dielectric cells arranged in a NAND configuration, which is representative of a cube which can include many planes and many word lines. The 2 planes of memory cells are defined at the cross-points of word lines 160, 161 acting as word lines WLn-1, WLn, with a first stack of semiconductor strips, a second stack of semiconductor strips and a third stack of semiconductor strips.

The first plane of memory cells includes memory cells 70, 71 in a NAND string on a semiconductor strip, memory cells 73, 74 in a NAND string on a semiconductor strip, and memory cells 76, 77 in a NAND string on a semiconductor strip. Each NAND string is connected to a ground select transistor on either side (e.g., ground select devices 90, 72 on either side of NAND string 70, 71).

The second plane of memory cells corresponds with a bottom plane in the cube in this example, and includes memory cells (e.g. 80, 82, 84) arranged in NAND strings in a similar manner those in the first plane.

As shown in the figure, the word line 161 acting as word line WLn includes vertical extensions which correspond with the material in the trench 120 shown in FIG. 5 between the stacks, in order to couple the word line 161 to the memory cells (cells 71, 74, 77 in the first plane) in the interface regions in the trenches between the semiconductor strips in all of the planes.

Memory cell strings in adjacent stacks alternate between a bit line end-to-source line end orientation and a source line end-to-bit line end orientation.

Bit lines $BL_N$ and $BL_{N-1}$ 96 terminate the memory cell strings, adjacent to the string select devices. For example, in the top memory plane, bit line $BL_N$ terminates the memory cell strings which have string select transistors 85 and 89. By contrast, the bit line is not connected to trace 88, because the strings of adjacent stacks alternate between a bit line end-to-source line end orientation and a source line end-to-bit line end orientation. So instead for this string, the corresponding bit line is connected to the other end of the string. In the bottom memory plane, bit line $BL_{N-1}$ terminates the memory cell strings which have corresponding string select transistors.

String select transistors 85, 89 are connected between respective NAND strings and string select lines $SSL_{n-1}$ and $SSL_n$ in this arrangement. Likewise, similar string select transistors on a bottom plane in the cube are connected between respective NAND strings and string select lines $SSL_{n-1}$ and $SSL_n$ in this arrangement. String select lines 106, 108, are connected to different ridges, to the gates of string select transistors in each memory cell string, and provide in this example string select signal $SSL_{n-1}$, $SSL_n$ and $SSL_{n+1}$.

By contrast, a string select transistor is not connected to trace 88, because the strings of adjacent stacks alternate between a bit line end-to-source line end orientation and a source line end-to-bit line end orientation. So instead for this string, the corresponding string select transistor is connected to the other end of the string. The NAND string with memory cells 73, 74 also has a string select device, not shown, on the other end of the string. The trace 88 is terminated by a source line 107.

Ground select transistors 90-95 are arranged at the first ends of the NAND strings. Ground select transistors 72, 75, 78 and corresponding second plane ground select transistors are arranged at the second ends of the NAND strings. Accordingly, ground select transistors are on both ends of the memory strings. Depending on the particular end of the memory string, the ground select transistor couples the memory string to a source line, or to a string select device and bit line.

The ground select signal GSL (odd) 159 and ground select signal GSL (even) 162 are on opposite sides of the word lines 160, 161 acting as word lines WLn-1, WLn. The ground select signal GSL (odd) 159 in this example is coupled to the gates of the ground select transistors 90-95, and can be implemented in the same manner as the word lines 160, 161. Similarly, the ground select signal GSL (even) 162 in this example is coupled to the gates of ground select transistors 72, 75, 78 and corresponding second plane ground select transistors, and can be implemented in the same manner as the word lines 160, 161. The string select transistors and ground select transistors can use the same dielectric stack as a gate oxide as the memory cells in some embodiments. In other embodiments, a typical gate oxide is used instead. Also, the channel lengths and widths can be adjusted as suits the designer to provide the switching function for the transistors.

Figure 29:
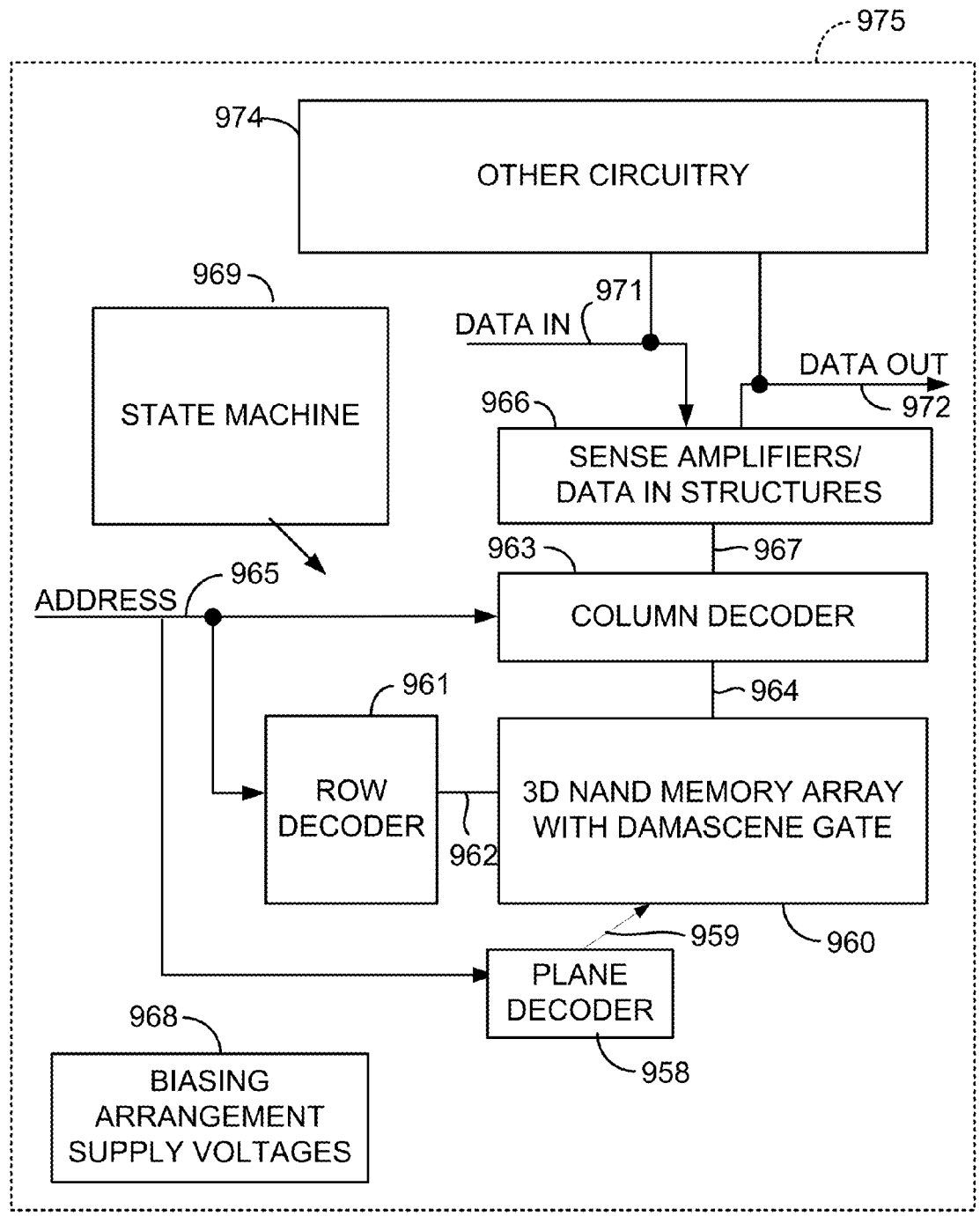
FIG. 29 is a schematic diagram of an integrated circuit including a 3D NAND-flash memory array with the damascene gate and row, column and plane decoding circuitry.

FIG. 29 is a schematic diagram of an integrated circuit including a 3D NAND-flash memory array with the damascene gate and row, column and plane decoding circuitry.

The integrated circuit line 975 includes a 3D NAND flash memory array 960, implemented as described herein, with a damascene gate or word line. A row decoder 961 is coupled to a plurality of word lines 962, and arranged along rows in the memory array 960. A column decoder 963 is coupled to a plurality of SSL lines 964 arranged along columns corresponding to stacks in the memory array 960 for reading and programming data from the memory cells in the array 960. A plane decoder 958 is coupled to a plurality of planes in the memory array 960 via bit lines 959. Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from inputoutput ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to inputoutput ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

FIGS. 30-37 are top views of parts of a process for manufacturing a memory device.

Figure 30:
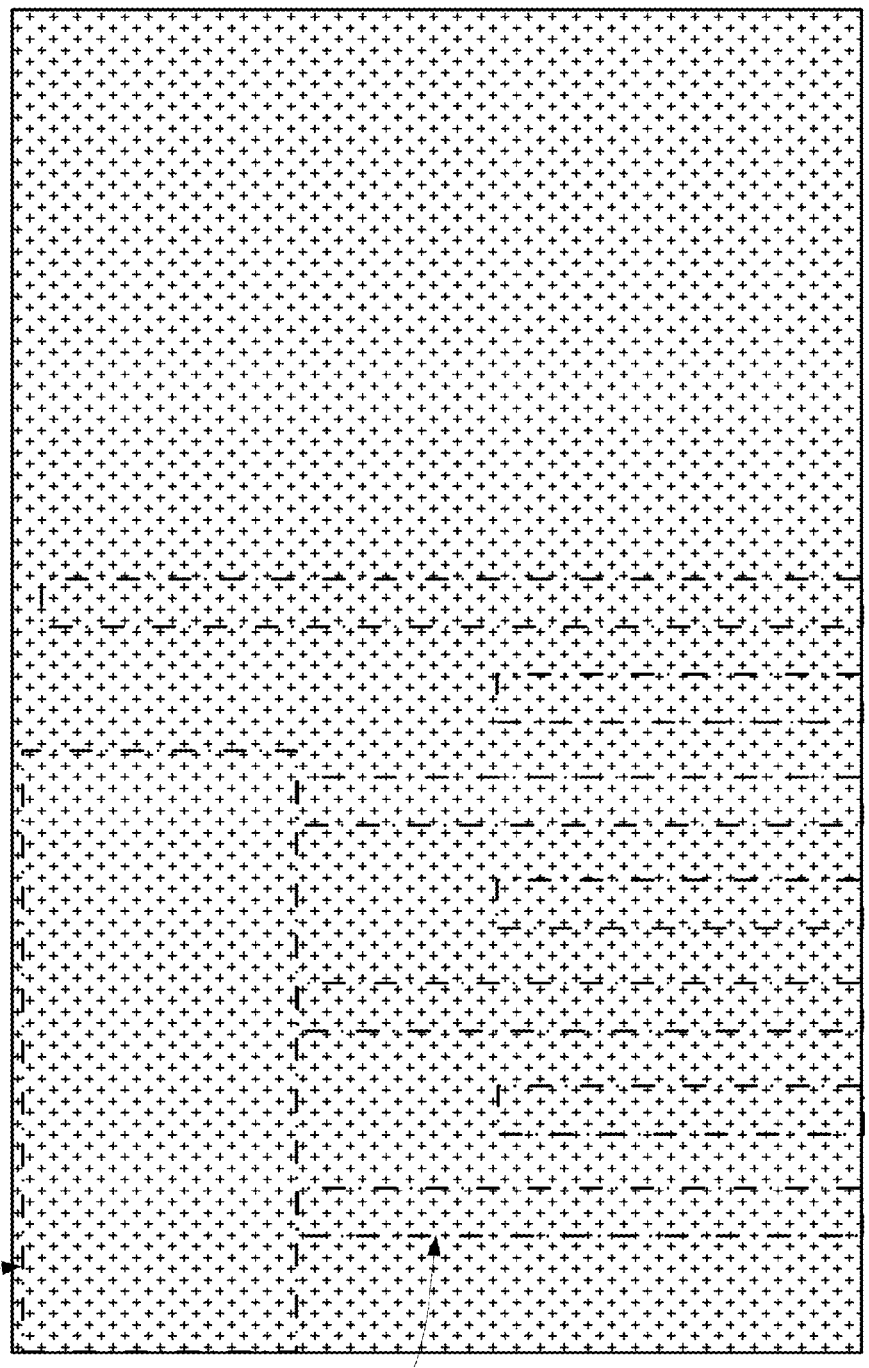
FIGS. 30-37 are top views of parts of a process for manufacturing a memory device.
Figure 31:
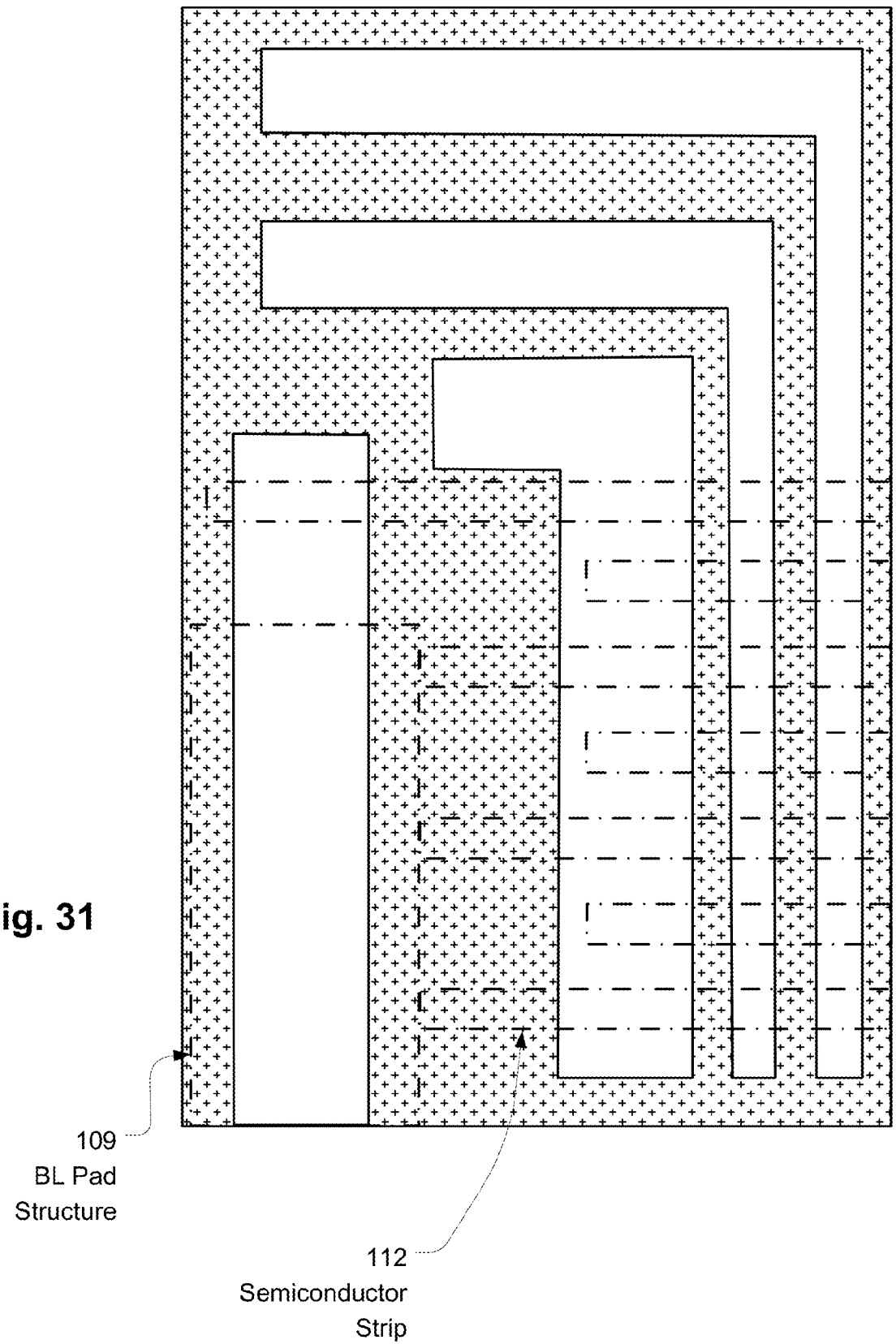

FIG. 30 shows a polysilicon layer, indicated by the "plus" pattern, covering semiconductor strips such as semiconductor strip 112 connected to BL PAD structure 109, which corresponds to stairstep structures 402B, 403B, 404B, 405B in FIG. 27. FIG. 30 shows a top view which corresponds to the perspective view of FIG. 6, prior to etching the polysilicon. Throughout FIGS. 30-37, to acts as a visual aid, the SSL gate structure and the semiconductor strips are shown by the alternating "dot dash" line, regardless of whether there is a covering layer. In FIG. 31, the polysilicon is etched. FIG. 31 shows a top view which corresponds to the perspective view of FIG. 6. The blank areas in FIG. 31 which are areas from which polysilicon has been removed, correspond to the trenches 33 in FIG. 6.

Figure 32:
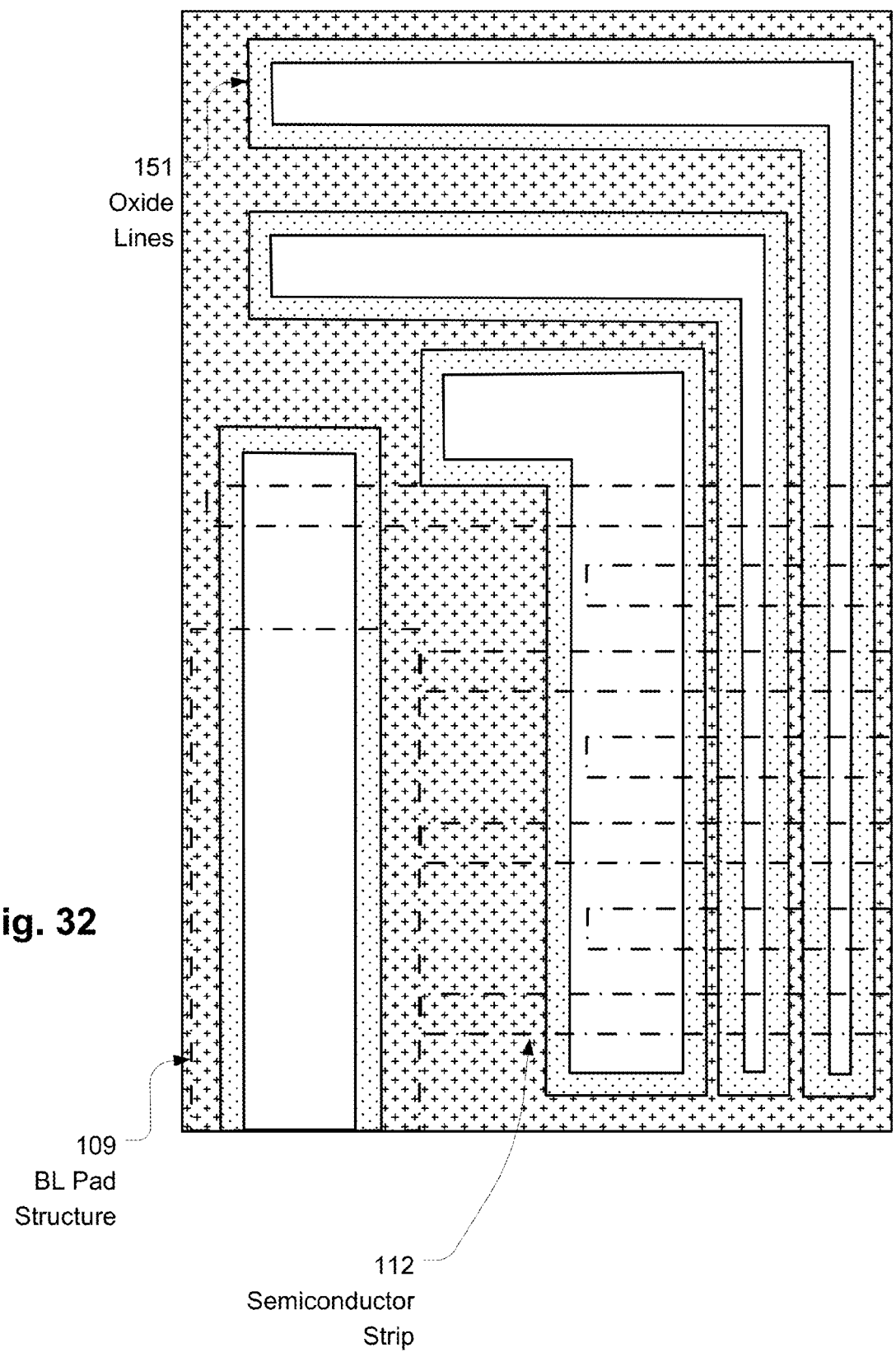
Figure 36:
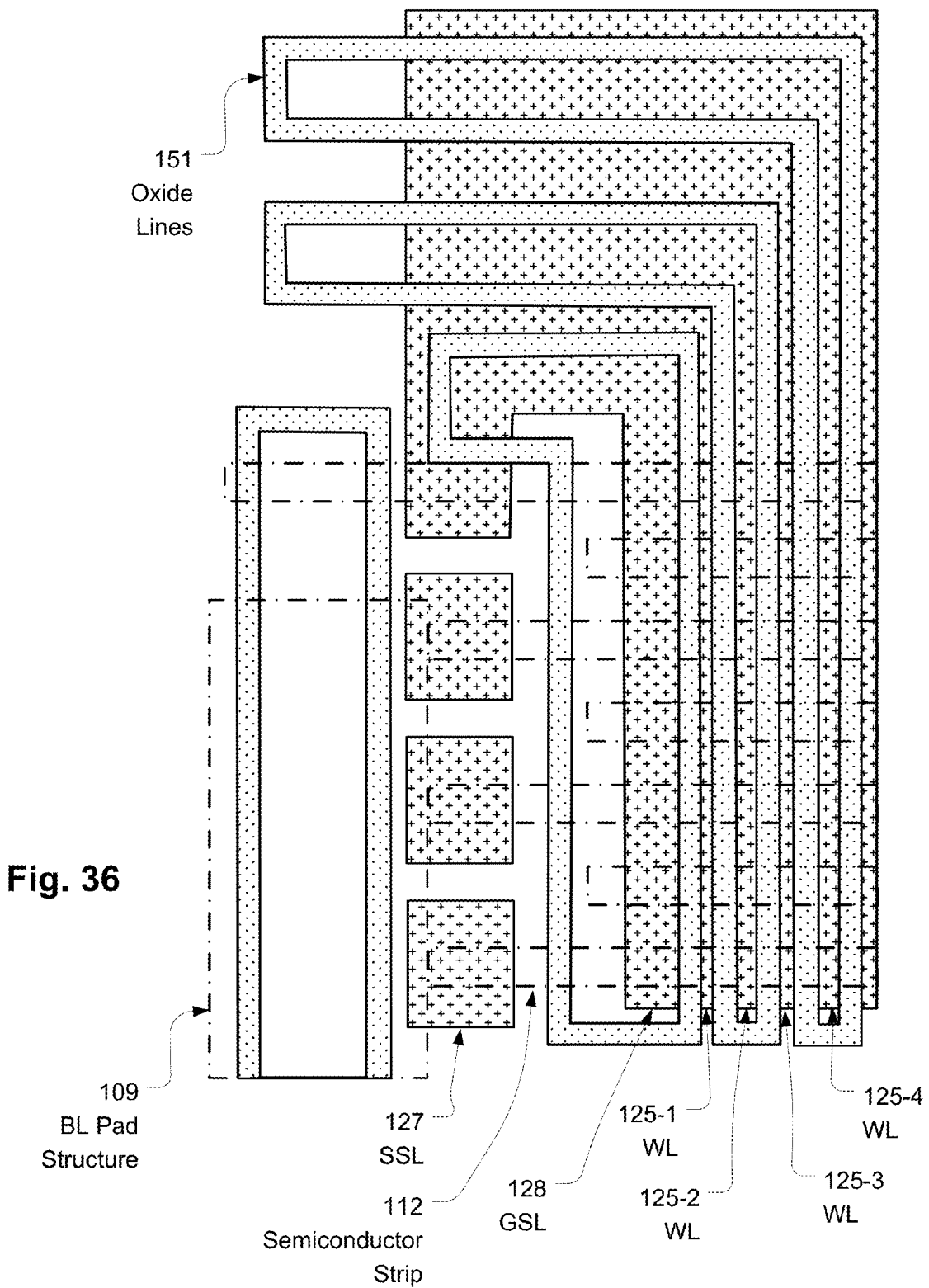

FIG. 32 shows a top view which corresponds to the perspective view of FIG. 8, after oxidation of exposed polysilicon surfaces. The oxide lines such as oxide lines 151 in FIG. 8 correspond to the oxide lines 34, 35, 37, and 38 in FIG. 8. Oxidation masks are not shown in FIG. 32. Multiple polysilicon lines are shorted together at this time; connecting polysilicon between the multiple polysilicon lines is eventually removed as shown in FIG. 36.

Figure 33:
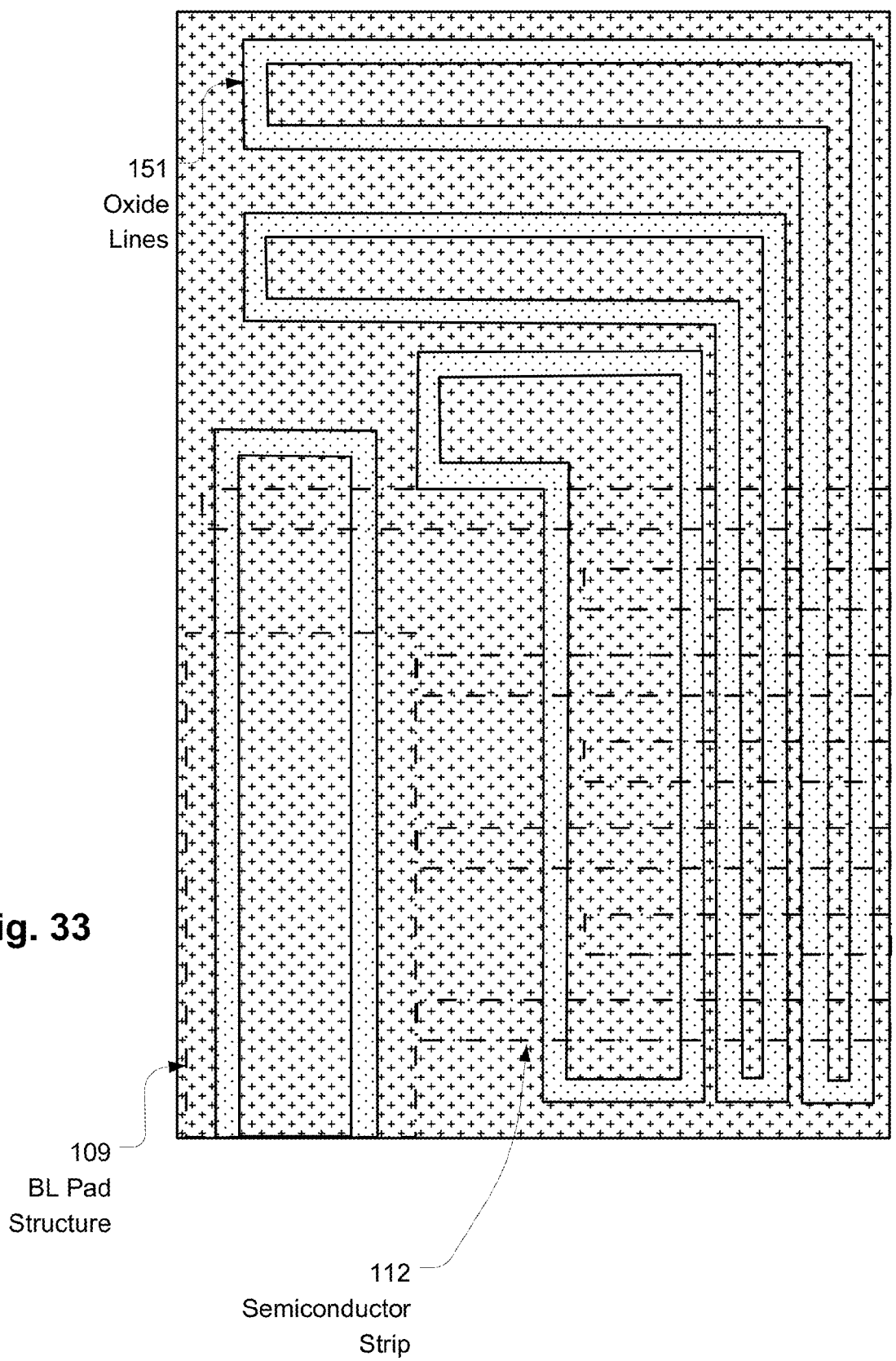

FIG. 33 shows a top view which corresponds to the perspective view of FIGS. 9-11, after performing polysilicon fill-in of the empty trenches between oxide lines following FIG. 32. Oxidation masks and overlying polysilicon which cover the oxide lines are not shown in FIG. 33.

Figure 34:
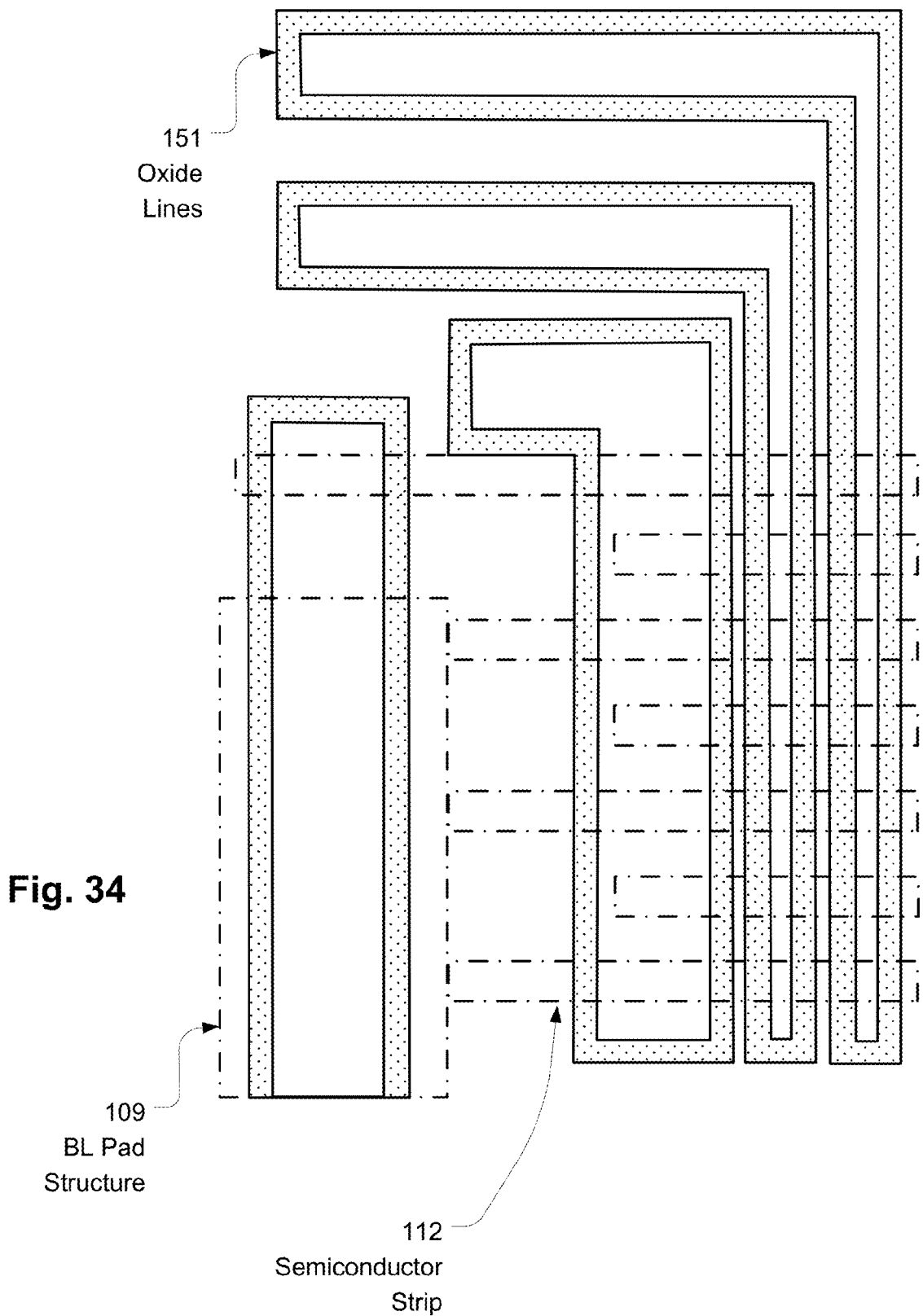

FIG. 34 shows a top view which corresponds to the perspective view of FIGS. 12-13, after removing the polysilicon fill following FIG. 33. Oxide voids are filled in by oxidation of polysilicon which had filled or partly filled such oxide voids.

Figure 35:
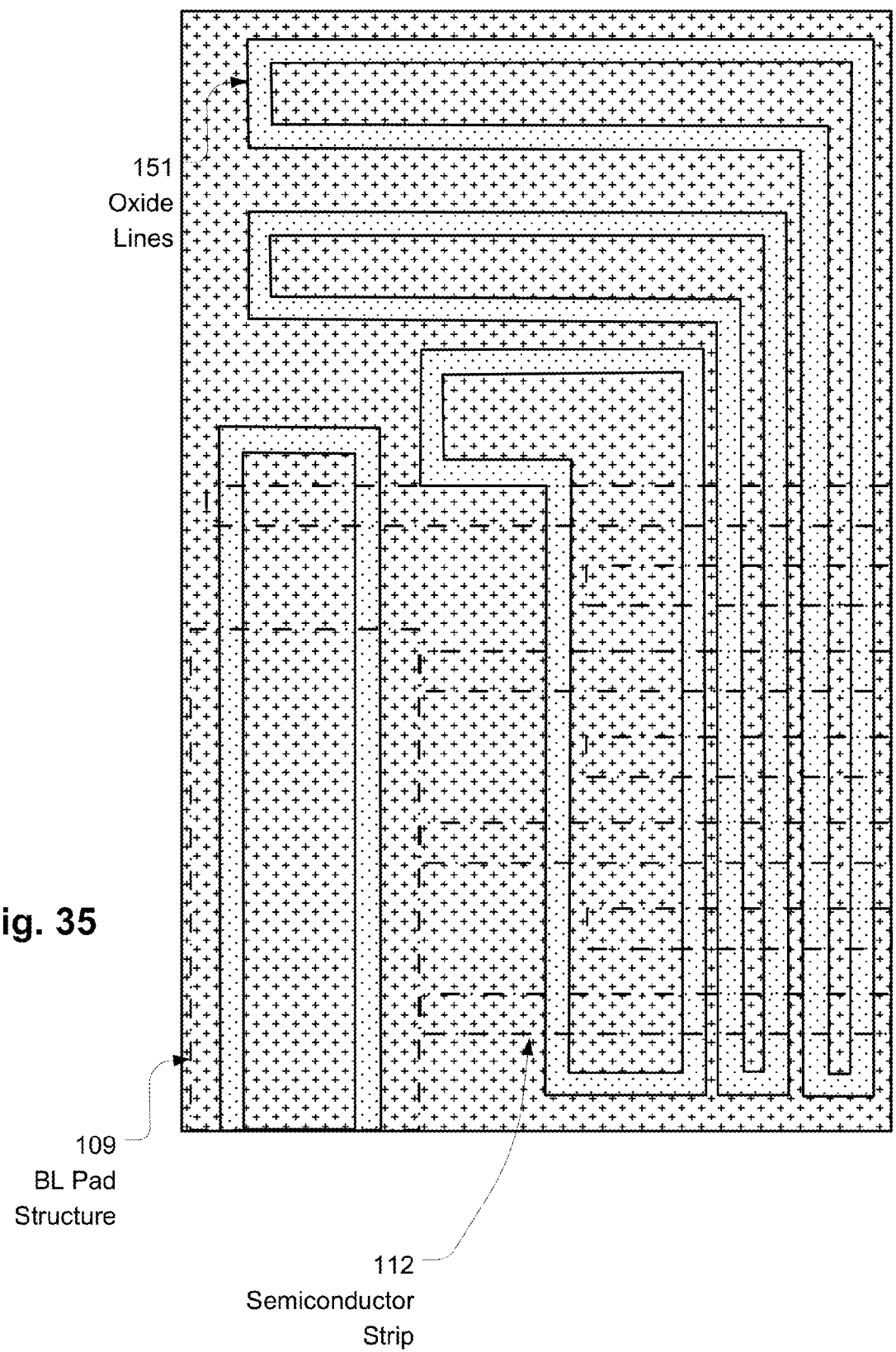

FIG. 35 shows a top view which corresponds to the perspective view of FIGS. 16-17, after moving the outer oxide layer from the oxide-nitride-oxide data storage layers covering the semiconductor strips, and converting exposed nitride to an outer oxide layer of the data storage layers covering the semiconductor strips following FIG. 34. Polysilicon fill is performed on the empty trenches between oxide lines. Multiple polysilicon lines are shorted together at this time; connecting polysilicon is eventually removed as shown in FIG. 36.

FIG. 36 shows a top view which corresponds to the perspective view of FIG. 18 prior to the silicide, after removing excess polysilicon which shorts together multiple polysilicon lines. Also shown are varying widths of polysilicon structures. The word lines such as word lines WL 125-1, WL 125-2 WL 125-3, and WL 125-4 are roughly L-shaped. One segment of the L-shape has a narrower width covering the semiconductor strips, and another segment of the L-shape has a larger width to connect to interlevel contacts. This larger width is supported by an additional mask in a self aligned double isolation process. Also, certain structures such as the SSL 127 and GSL 128 have a larger width than the narrow segment of the word lines.

Figure 37:
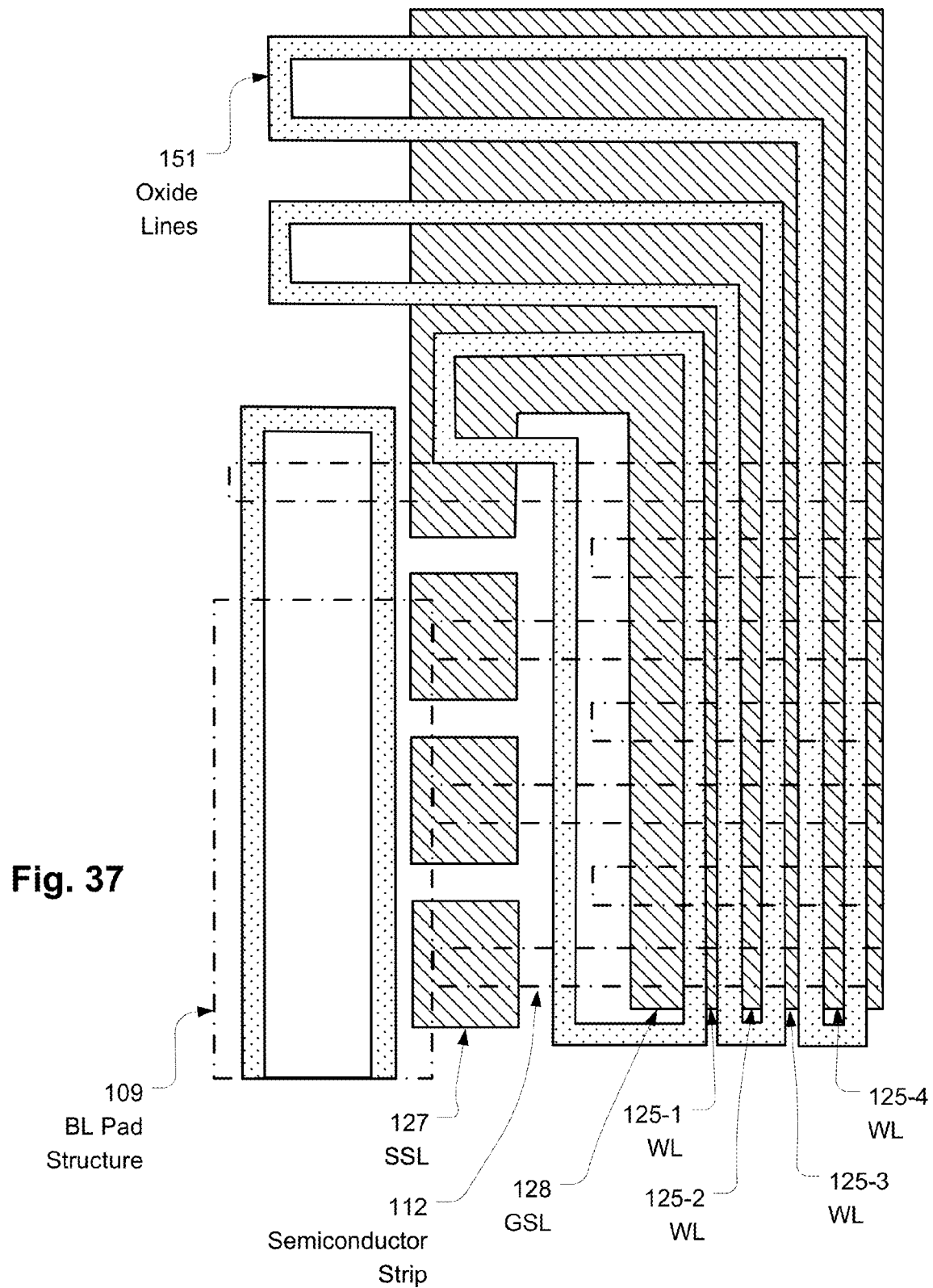

FIG. 37 shows a top view which corresponds to the perspective view of FIG. 18 after the silicide, shown as a diagonal line pattern.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of making a three dimensional array of nonvolatile memory cells, comprising:
    making a first plurality of material lines over a plurality of stacked nonvolatile memory structures, the first plurality of material lines separated by a first plurality of word line trenches that separate neighboring ones of the first plurality of material lines;
    making a plurality of partly oxidized structures from the first plurality of material lines by oxidizing both sides of material lines in the first plurality of material lines, the plurality of partly oxidized structures including a plurality of oxide lines bounding a first plurality of narrowed material lines, wherein narrowed material lines in the first plurality of narrowed material lines have a narrower width than the material lines in the first plurality of material lines;
    removing the first plurality of narrowed material lines bounded by the plurality of oxide lines, to make a second plurality of word line trenches; and
    making a plurality of word lines over the plurality of stacked nonvolatile memory structures in the first plurality of word line trenches and the second plurality of word line trenches.

2. The method of claim 1, further comprising:
    after removing the first plurality of narrowed material lines covering the plurality of stacked nonvolatile memory structures, etching exposed oxide covering the plurality of stacked nonvolatile memory structures in the second plurality of word line trenches; and making oxide to cover the plurality of stacked nonvolatile memory structures in the second plurality of word line trenches.

3. The method of claim 1, further comprising:

after removing the first plurality of narrowed material lines covering the plurality of stacked nonvolatile memory structures, etching exposed oxide covering the plurality of stacked nonvolatile memory structures in the second plurality of word line trenches; and depositing the oxide covering the plurality of stacked nonvolatile memory structures in the second plurality of word line trenches.

4. The method of claim 1, further comprising:

after removing the first plurality of narrowed material lines covering the plurality of stacked nonvolatile memory structures, etching exposed oxide covering the plurality of stacked nonvolatile memory structures in the second plurality of word line trenches, until exposing nitride covering the plurality of stacked nonvolatile memory structures in the second plurality of word line trenches; and making oxide to cover exposed nitride of the plurality of stacked nonvolatile memory structures in the second plurality of word line trenches.

5. The method of claim 1, further comprising:

after removing the first plurality of narrowed material lines covering the plurality of stacked nonvolatile memory structures, etching exposed oxide covering the plurality of stacked nonvolatile memory structures in the second plurality of word line trenches; and oxidizing an exposed nitride layer covering the plurality of stacked nonvolatile memory structures in the second plurality of word line trenches.

6. The method of claim 1, further comprising:

before removing the first plurality of narrowed material lines covering the plurality of stacked nonvolatile memory structures, making a third plurality of material lines in the first plurality of word line trenches; and prior to making the word lines in the first plurality of word line trenches, removing the second plurality of material lines from the first plurality of word line trenches, at least partly while removing the first plurality of narrowed material lines.

7. The method of claim 1, wherein removing the first plurality of narrowed material lines leaves material residue in at least one word line trench of the second plurality of word line trenches, the method further comprising:

after removing the first plurality of narrowed material lines, oxidizing the material residue left in at least one word line trench of the second plurality of word line trenches.

8. The method of claim 1, wherein an oxide line of the plurality of oxide lines has a void, the method further comprising:

after removing the first plurality of narrowed material lines, oxidizing material residue left in at least one word line trench of the second plurality of word line trenches to at least partly fill the void.

9. The method of claim 1, wherein making the word lines is a damascene process.

10. The method of claim 1, further comprising:

prior to oxidizing the both sides including first surfaces and second surfaces of the material lines in the first plurality of material lines, making oxidation masks covering third surfaces of the material lines in the first plurality of material lines, the third surfaces joining the first surfaces and the second surfaces of the material lines.

11. The method of claim 1, further comprising:

prior to oxidizing the both sides including first surfaces and second surfaces of the material lines in the first plurality of material lines, making oxidation masks covering third surfaces of the material lines in the first plurality of material lines, the third surfaces joining the first surfaces and the second surfaces of the material lines, wherein the oxidation masks decrease oxidation of the third surfaces while oxidizing the first surfaces and the second surfaces.

12. The method of claim 1, further comprising:

prior to oxidizing the both sides including first surfaces and second surfaces of the material lines in the first plurality of material lines, making oxidation masks covering third surfaces of the material lines in the first plurality of material lines, the third surfaces joining the first surfaces and the second surfaces of the material lines; and after oxidizing the first surfaces and the second surfaces, removing the oxidation masks.

13. The method of claim 1, further comprising:

making oxidation masks covering third surfaces of the material lines in the first plurality of material lines, the third surfaces joining the first surfaces and the second surfaces of the material lines;

depositing material over the oxidation masks at least partly while filling in the first plurality of word line trenches with material;

removing the material over the oxidation masks and at least partly while removing material over the first plurality of word line trenches, until at least exposing the oxidation masks;

removing the oxidation masks; and removing the material from the first plurality of word line trenches at least partly while removing the first plurality of narrowed material lines.

14. The method of claim 1, wherein forming the first plurality of material lines includes, making a layer of material over the plurality of stacked nonvolatile memory structures, and removing excess material from the layer to leave the first plurality of material lines and form the first plurality of word line trenches between neighboring ones of the first plurality of material lines.

15. The method of claim 1, further comprising:

prior to making the first plurality of word line trenches, forming the plurality of stacked nonvolatile memory structures including a plurality of semiconductor strips separated by insulating material, and charge storage structures covering the plurality of semiconductor strips.

16. The method of claim 1, wherein the plurality of material lines include semiconductor lines.

17. A method of making a three dimensional array of nonvolatile memory cells, comprising:

forming a plurality of partly oxidized silicon lines over a plurality of stacked nonvolatile memory structures, the plurality of partly oxidized silicon lines having a plurality of unoxidized silicon lines at intermediate parts of the plurality of partly oxidized lines and a plurality of oxidized lines at outer parts of the plurality of partly oxidized lines wherein narrowed material lines in the plurality of partly oxidized silicon lines have a narrower width than material lines in the plurality of unoxidized silicon lines;

making a plurality of word line trenches in the plurality of partly oxidized silicon lines, by removing the plurality of unoxidized silicon lines from the intermediate parts of the plurality of partly oxidized lines, leaving the plurality of oxidized lines at the outer parts of the plurality of partly oxidized lines; and making a plurality of word lines in the plurality of word line trenches over the plurality of stacked nonvolatile memory structures.

18. The method of claim 17, further comprising:

after removing the plurality of unoxidized silicon lines over the plurality of stacked nonvolatile memory structures, etching exposed oxide covering the plurality of stacked nonvolatile memory structures in the plurality of word line trenches; and making oxide to cover the plurality of stacked nonvolatile memory structures in the plurality of word line trenches.

19. The method of claim 17, wherein forming the plurality of partly oxidized silicon lines over the plurality of stacked nonvolatile memory structures includes, making oxidation masks covering top surfaces of silicon lines in a plurality of silicon lines over the plurality of stacked nonvolatile memory structures; and oxidizing both exposed surfaces of the silicon lines in the plurality of silicon lines.

\* \* \* \* \*